US006890584B2

(12) United States Patent
Leenders et al.

(10) Patent No.: US 6,890,584 B2
(45) Date of Patent: May 10, 2005

(54) FLEXOGRAPHIC INK CONTAINING A POLYMER OR COPOLYMER OF A 3,4-DIALKOXYTHIOPHENE

(75) Inventors: Luc Leenders, Mortsel (BE); Eddie Daems, Mortsel (BE); Frank Louwet, Mortsel (BE); Rafaël Samijn, Mortsel (BE); Jean-Pierre Tahon, Mortsel (BE); Roger Van den Bogaert, Schoten (BE)

(73) Assignee: Agfa-Gevaert, Mortsel (BE)

(*) Notice: Subject to any disclaimer, the term of this patent is extended or adjusted under 35 U.S.C. 154(b) by 0 days.

(21) Appl. No.: 10/175,948

(22) Filed: Jun. 20, 2002

(65) Prior Publication Data

US 2003/0144465 A1 Jul. 31, 2003

Related U.S. Application Data

(63) Continuation-in-part of application No. 09/892,011, filed on Jun. 26, 2001, now Pat. No. 6,632,472, which is a continuation-in-part of application No. 10/103,061, filed on Mar. 21, 2002, which is a continuation-in-part of application No. 10/105,758, filed on Mar. 25, 2002.

(60) Provisional application No. 60/214,418, filed on Jun. 28, 2000, provisional application No. 60/294,325, filed on May 30, 2001, provisional application No. 60/349,572, filed on Jan. 18, 2002, provisional application No. 60/294,325, filed on May 30, 2001, provisional application No. 60/349,572, filed on Jan. 18, 2002, provisional application No. 60/350,453, filed on Jan. 22, 2002, and provisional application No. 60/382,577, filed on May 22, 2002.

(30) Foreign Application Priority Data

| Jun. 22, 2001 | (WO) | ............................... PCT/EP01/07082 |
| Dec. 4, 2001 | (EP) | ............................................... 01000698 |
| Dec. 10, 2001 | (EP) | ............................................... 01000730 |
| Mar. 19, 2002 | (WO) | ............................... PCT/EP02/03062 |
| Mar. 19, 2002 | (WO) | ............................... PCT/EP02/03063 |
| May 16, 2002 | (EP) | ............................................... 02100500 |

(51) Int. Cl.[7] ............................................... B41M 1/04
(52) U.S. Cl. .................... 427/58; 106/31.13; 106/31.6; 106/31.76; 106/31.8; 524/366; 524/386; 525/186; 525/189; 528/377; 528/380; 528/480; 528/481; 528/501; 523/309
(58) Field of Search ............... 427/58, 74, 64; 106/31.13, 31.6, 31.76, 31.8; 524/366, 386; 525/186, 189; 528/377, 380, 480, 481, 501; 523/309; 252/500

(56) References Cited

U.S. PATENT DOCUMENTS

| 3,928,281 A | 12/1975 | Uchigaki et al. |
| 3,957,555 A | 5/1976 | Bondi |
| 4,515,646 A | 5/1985 | Walker et al. |
| 4,649,224 A | 3/1987 | Panek et al. |
| 4,696,849 A | 9/1987 | Mobley et al. |
| 4,709,099 A | 11/1987 | Panek et al. |
| 4,853,054 A | 8/1989 | Turner et al. |
| 4,959,162 A | 9/1990 | Armes et al. |
| 5,045,375 A | 9/1991 | Davis et al. |
| 5,104,580 A | 4/1992 | Henry et al. |
| 5,158,922 A | 10/1992 | Hinney et al. |
| 5,354,613 A | 10/1994 | Quintens et al. |
| 6,401,537 B1 | 3/1995 | Kochem et al. |

(Continued)

FOREIGN PATENT DOCUMENTS

| DE | 42 11 459 A1 | 10/1993 |
| DE | 196 27 071 A1 | 1/1998 |
| EP | 0 440 957 A2 | 8/1991 |
| EP | 0589529 A1 | 3/1994 |
| EP | 0 593 111 A1 | 4/1994 |
| EP | 0 614 123 A1 | 9/1994 |
| EP | 0 686 662 A2 | 12/1995 |
| EP | 1 003 179 A1 | 5/2000 |
| EP | 1 010 733 A2 | 6/2000 |
| EP | 1061549 A1 | 3/2001 |
| EP | 1 081 548 A1 | 3/2001 |
| FR | 2 618 802 A1 | 2/1989 |
| WO | WO 89/03876 A1 | 5/1989 |
| WO | WO 90/02763 A1 | 3/1990 |
| WO | 99/34371 A1 | 7/1999 |
| WO | WO 9934371 A1 * | 7/1999 ............ H01B/1/12 |
| WO | 99/66483 A1 | 12/1999 |
| WO | WO 02/000759 A1 | 3/2002 |

OTHER PUBLICATIONS

Product Description for Baytron P.*

Armes et al., *J. Chem. Soc., Chem. Comm.* 288–290 (1987).

Carter et al., *Applied Physics Letters*, 70 (16), 2067–2069 (Apr. 21, 1997).

"Chemical Synthesis, Characterization, and Electrochemical Studies of Poly (3,4-ethylenedioxythiophene) Poly(styrene-4-sulfonate) Composites," *Chemistry of Materials*, 11(2), 262–268 (Feb. 1999).

Kelzan Xanthan Gum (CPKelco Indus) Product Data Sheet(s) www.cpkelco.com/xanthan/industrial.

International Search Report PCT/EP02/06616 (Oct. 16, 2002).

*Primary Examiner*—Margaret G. Moore
*Assistant Examiner*—Marc S. Zimmer
(74) *Attorney, Agent, or Firm*—Leydig, Voit & Mayer Ltd.

(57) ABSTRACT

A non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium, characterized in that the polymer or copolymer of a 3,4-dialkoxythiophene is present in a concentration of at least 0.1% by weight in the ink and that the ink is capable of producing a colorimetrically additive transparent print; a method of preparing the flexographic ink; and a flexographic printing process therewith.

28 Claims, No Drawings

U.S. PATENT DOCUMENTS

| | | |
|---|---|---|
| 5,443,944 A | 8/1995 | Krafft et al. |
| 5,482,908 A | 1/1996 | Le-Khac |
| 5,567,355 A | 10/1996 | Wessling et al. |
| 5,604,267 A | 2/1997 | Duffy |
| 5,652,067 A | 7/1997 | Ito et al. |
| 5,766,515 A | 6/1998 | Jonas et al. |
| 5,767,624 A | 6/1998 | Gordon et al. |
| 6,004,483 A | 12/1999 | Jonas et al. |
| 6,083,635 A | 7/2000 | Jonas et al. |
| 6,084,040 A | 7/2000 | Jonas et al. |
| 6,171,678 B1 | 1/2001 | Holeschovsky et al. |
| 6,328,833 B1 * | 12/2001 | Holeschovsky et al. ...... 156/72 |
| 6,358,437 B1 * | 3/2002 | Jonas et al. .................. 252/500 |
| 6,376,105 B1 | 4/2002 | Jonas et al. |
| 2002/0077450 A1 | 6/2002 | Kirchmeyer et al. |
| 2002/0151094 A1 | 10/2002 | Andriessen |
| 2003/0057403 A1 | 3/2003 | Willaert et al. |
| 2003/0062510 A1 * | 4/2003 | Van den Bogaert ......... 252/500 |
| 2004/0096695 A1 | 5/2004 | Willaert et al. |

* cited by examiner

FLEXOGRAPHIC INK CONTAINING A POLYMER OR COPOLYMER OF A 3,4-DIALKOXYTHIOPHENE

The application is a continuation in part of U.S. application Ser. No. 09/892,011 filed Jun. 26, 2001, U.S. Pat. No. 6,632,472, claims the benefit of U.S. Provisional Application No. 60/349,572 filed Jan. 18, 2002 which is incorporated by reference, claims the benefit of U.S. Provisional Application No. 60/350,453 filed Jan. 22, 2002 which is incorporated by reference, is a continuation in part of U.S. application Ser. No. 10/103,061 filed Mar. 21, 2002, is a continuation in part of U.S. application Ser. No. 10/105,758 filed Mar. 25, 2002, and claims the benefit of U.S. Provisional Application No. 60/382,577 filed May 22, 2002 which is incorporated by reference.

FIELD OF THE INVENTION

The present invention relates to flexographic inks containing a polymer or copolymer of a 3,4-dialkoxythiophene.

BACKGROUND OF THE INVENTION

Flexographic inking systems are used for printing a wide variety of substrates both porous such as paper and paperboard and non-porous such as polymer films and foils and are based on a two or three-roll system or a system that uses enclosed doctor blades. The three-roll system uses a rubber pickup roll that picks up the ink and transfers it to an anilox roll (engraved metal or ceramic roll). The ink fills the engraved cells and is then transferred to plates (either rubber or plastic), where the image is raised in relief from the background, non-image area. A final transfer then occurs from the plate to the substrate. Flexographic presses run at speeds in the range of 0.25 to 10.2 m/s.

Flexographic inks may be water- or solvent-based and are suitable for overprinting colour on colour, water-based inks typically having a pH of at least 8.5. Flexographic inks are known as liquid inks because of their low viscosity: 10 to 100 mPa.s under printing conditions. Prints produced by flexography can fulfil a wide range of functional effects other than the provision of information such as antistatic properties, e.g. for packaging for electronic components sensitive to electrical discharges, and electroconductive properties.

Flexographic inks containing electroconductive agents are reported in the patent literature. These are based upon metal particles, see for example WO 00/29208, U.S. Pat. No. 5,189,952, U.S. Pat. No. 4,221,830, U.S. Pat. No. 4,282,692, U.S. Pat. No. 5,286,415, U.S. Pat. No. 5,389,403 and U.S. Pat. No. 5,656,081, or carbon blacks particles, see for example JP 49-068807A, WO00/77408, U.S. Pat. No. 5,286,415 and U.S. Pat. No. 5,389,403. Metallic inks are made from aluminum or bronze powders mixed with a suitable resin soluble. Such inks cannot be integrated into colour work due to the non-transparency of the prints made therewith.

Flexographic inks containing electroconductive agents capable of producing prints which can be incorporated into the informational attributes of flexible packaging, but also fulfilling an additional functional role are therefore required.

WO 99/34371 discloses a silk screen paste with a viscosity of 1 to 200 dpa.s ($10^2$ to $2\times10^4$ mpa.s) containing a solution or dispersion of a conductive polymer paste and optionally binders, thickeners and fillers. WO 99/34371 further discloses a process for preparing silk screen pastes in which a solution or dispersion with a content of <2% by weight of poly(3,4-ethylenedioxythiophene) [PEDOT]/poly(styrenesulfonate) [PSS] is concentrated to a solids content of >2% by removing the solvent and in which subsequently binder and/or filler are optionally added. Example 1 discloses evaporation of water from a 1.3% by weight solids dispersion of PEDOT/PSS in water to a 3% by weight solids dispersion in a rotary evaporator at 45° C. and 20 mbar.

EP-A 1 081 549 discloses a coating composition comprising a solution of a substituted or unsubstituted thiophene-containing electrically-conductive polymer, a film-forming binder, and an organic solvent media; the media having a water content of less than 37 weight percent. Coating dispersions with 0.1% by weight of PEDOT/PSS, i.e. 0.0294% by weight of PEDOT since BAYTRON™ P contains a weight ratio PEDOT to PSS of 1:2.4, and with between 8 and 25% by weight of water were disclosed in the invention examples using BAYTRON™ P, a 1.22% by weight dispersion of PEDOT/PSS in water, as the starting material.

EP-A 1 081 546 discloses a coating composition comprising a solution of an electrically-conductive polymer and an organic solvent media wherein the solvents are selected from the group consisting of alcohols, ketones, cycloalkanes, arenes, esters, glycol ethers and their mixtures; the media having a water content of less than 12 weight percent. Coating dispersions with PEDOT/PSS concentrations between 0.02 and 0.1% by weight, i.e. between 0.00588 and 0.0294% by weight of PEDOT since BAYTRON™ P contains a weight ratio PEDOT to PSS of 1:2.4, and with between 2 and 8% by weight of water were disclosed in the invention examples using BAYTRON™ P, a 1.22% by weight dispersion of PEDOT/PSS in water, as the starting material.

EP-A 1 081 548 discloses a coating composition comprising a substituted or unsubstituted thiophene-containing electrically-conductive polymer and an organic solvent media; the media having a water content of less than 12 weight percent. Coating dispersions with PEDOT/PSS concentrations between 0.02 and 0.1% by weight, i.e. between 0.00588 and 0.0294% by weight of PEDOT since BAYTRON™ P contains a weight ratio PEDOT to PSS of 1:2.4, and with between 2 and 8% by weight of water were disclosed in the invention examples using BAYTRON™ P, a 1.22% by weight dispersion of PEDOT/PSS in water, as the starting material.

EP-A 593 111 discloses a sheet or web material comprising a water resistant support or paper support coated with at least one water resistant resin layer wherein said resin support or resin layer is coated with an outermost antistatic layer containing as an essential component a polythiophene with conjugated polymer backbone in the presence of a polymeric polyanion compound, characterized in that said antistatic layer contains also a hydrophobic organic polymer having a glass transition value (Tg) of at least 40° C., said polythiophene being present at a coverage of at least 0.001 g/m² and the weight ratio of said polythiophene organic polymer being in the range if 1/10 to 1/1000.

EP-A 821 025 discloses a thermal and mechanical formable polymer foil characterized by a transparent antistatic layer of a mixture of 3,4-polyethylenedioxythiophene with a thermally or mechanically formable binder.

WO 01/65903 discloses a method of forming an EMI shield comprising the steps of: (a) providing a thermoformable film comprising a first side and a second side; (b) applying an extensible conductive coating to the thermoformable film by printing or coating processes comprising flexographic printing, screen printing, gravure printing, offset printing, letter press printing, pad printing, slot coating, flood coating, spray coating and jet printing; (c) cutting the thermoformable film into a three-dimensional shape; and (e) applying a compressible EMI gasket to the thermoformable film, wherein steps (b) through (e) may be performed in any order.

Commercially non-transparent conductive flexographic inks on the basis of carbon black, e.g. THERMOKETT™ Conductive Ink and Black VX7011 from Akzo Nobel Inks, and metallic pigments are available. There is a need for flexographic inks capable of producing transparent conductive prints.

ASPECTS OF THE INVENTION

It is therefore an aspect of the present invention to provide a flexographic ink containing an electroconductive agent and capable of producing a transparent print.

It is a further aspect of the present invention to provide a method of preparing a flexographic ink containing an electroconductive agent capable of producing a transparent print.

It is also an aspect of the present invention to provided a flexographic printing process using a flexographic ink containing an electroconductive agent and capable of providing a transparent print on an optionally subbed substrate.

Further aspects and advantages of the invention will become apparent from the description hereinafter.

SUMMARY OF THE INVENTION

In fulfilling the need for a flexographic ink containing an electroconductive agent and capable of producing a transparent print, inorganic semiconductors transparent to visible light (400 to 750 nm) such as vanadium pentoxide, cuprous iodide and indium tin dioxide pigments are obvious candidates as electroconductive agents together with intrinsically conductive polymers such as polypyrroles, polyanilines, polyacetylene, polyparaphenylene, polythiophenes, polyphenylenevinylene, polythienylenevinylene and polyphenylenesulphide etc. However, it has been found that flexographic inks containing inorganic semiconductors exhibit poor resistance to abrasion and poor adhesion upon flexing/bending of the substrate and that flexographic inks containing polyanilines produce prints that are transparent but insufficiently conductive (e.g. a surface resistance of $10^7$ Ω/square at an optical density of 0.01) or conductive and dominated by a high optical density green background (e.g. a surface resistance of 1000 Ω/square at an optical density >1.0), the intrinsic green colour of polyanilines, whereas flexographic inks containing polythiophenes surprisingly produced transparent prints which were readily overprintable and exhibited surface resistances down to 5000 Ω/square for non-coloured transparent prints and down to 6000 Ω/square for differently coloured transparent prints with optical density of up to 0.7. Furthermore, such layers exhibited excellent adhesion to a variety of substrates and excellent resistance to abrasion, water, alkali and organic solvents.

Aspects of the present invention are realized by a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder in an organic solvent or aqueous medium, characterized in that the polymer or copolymer of a 3,4-dialkoxythiophene is present in a concentration of at least 0.1% by weight in the ink and that the ink is capable of producing a colorimetrically additive transparent print.

Aspects of the present invention are also realized by a method for preparing the above-described flexographic ink comprising the steps of: i) concentrating an aqueous dispersion of the polymer or copolymer of (3,4-dialkoxythiophene) and the polyanion; and ii) adding the latex binder.

Aspects of the present invention are also provided by a flexographic printing process comprising the steps of: providing the above-described flexographic ink; and printing the printing ink on an optionally subbed substrate thereby producing a colorimetrically additive transparent print.

Aspects of the present invention are also provided by a non-dye containing flexographic ink containing at least 0.1% by weight of a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium and the ink is capable of producing a colorimetrically additive transparent print obtainable by the above-described method.

Preferred embodiments are disclosed in the dependent claims.

DETAILED DESCRIPTION OF THE INVENTION

Definitions

The term alkoxy means all variants possible for each number of carbon atoms in the alkoxy group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term oxyalkylenealkoxy means two oxygen atoms linked by an alkylene group. An alkylene group is a substituted or unsubstituted hydrocarbon group e.g. a —$(CH_2)_n$— group where n is an integer between 1 and 5, which may be substituted with an alkoxy, aryloxy, alkyl, aryl, alkaryl, alkyloxyalkyl, alkyloxyalkaryl, alkyloxyaryl, hydroxy, carboxy, carboxyalkyl, carboxyamino, sulfo or alkylsulfo group.

The term derivatives as used in connection with a particular polymer refers to variants thereof substituted with alkyl, alkoxy, alkyloxyalkyl, carbbxy, alkylsulfonato and carboxy ester groups.

The term transparent layer as used in disclosing the present invention means permitting the passage of light in such a way that objects can be clearly seen through the layer.

The term colorimetrically additive as used in disclosing the present invention means having a colour whose component standard colours are additive with the component standard colours of adjacent layers.

The term aqueous medium means a medium containing water and water-miscible organic solvents containing between 50% by weight of water and 100% by weight of water.

The term solvent medium means a medium containing organic solvents and may also contain dissolved water in a concentration of less than 50% by weight.

The term dye, according to the present invention, means a coloring agent having a solubility of 10 mg/L or more in the medium in which it is applied and under the ambient conditions pertaining.

The term pigment is defined in DIN 55943, herein incorporated by reference, as an inorganic or organic, chromatic or achromatic coloring agent that is practically insoluble in the application medium under the pertaining ambient conditions, hence having a solubility of less than 10 mg/L therein.

Freeze drying according to the present invention is a lyophilization process in which a substance is first frozen and then the quantity of solvent (generally water) is reduced, first by sublimation (=primary drying process) and then by desorption (=secondary drying process) until the temperature of the shelves becomes equal to the atmospheric temperature in the freeze dryer. The freeze-drying process is enabled by the ability of solid materials such as ice to sublime (change directly into a gas without passing through a liquid phase) under the right conditions.

The term "dry product", according to the present invention, means dry to touch and is associated with no apparent liquid phase.

The term paste, according to the present invention, means a soft plastic mixture or composition.

The term Newtonian behaviour refers to a viscosity with no more than 10% variation in the shear rate range 1 to 80 $s^{-1}$ measured with increasing shear rate for concentrations in the medium concerned up to 2% by weight in the absence of other ingredients.

The term non-Newtonian behaviour refers to a viscosity with more than 10% variation in the shear rate range 1 to 80 $s^{-1}$ measured with increasing shear rate for concentrations in the medium concerned below 2% by weight and in the absence of other ingredients.

The term layer according to the present invention means a continuous or discontinuous coating.

The term pattern according to the present invention means a discontinuous coating.

The term flexible as used in disclosing the present invention means capable of following the curvature of a curved object such as a drum e.g. without being damaged.

The electric resistance of a layer is generally expressed in terms of surface resistance $R_s$ (unit $\Omega$; often specified as $\Omega$/square). Alternatively, it may be expressed in terms of volume resistivity $R_v = R_s \cdot d$, wherein d is the thickness of the layer, volume conductivity $k_v = 1/R_v$ [unit: S(iemens)/cm] or surface conductance $k_s = 1/R_s$ [unit: S(iemens).square].

The term 'electroconductive' according to the present invention means having a surface resistivity below $10^6$ $\Omega$/square. $10^6$ $\Omega$/square is typically regarded as a value of surface resistivity which distinguishes electroconductive materials from antistatic materials. Antistatic materials typically have a surface resistivity in the range from $10^6$ to $10^{11}$ $\Omega$/square and are not suitable as an electrode.

Conductivity enhancement refers to a process in which contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant $\geq 15$, e.g. N-methyl-pyrrolidinone, temperatures below 100° C. can be used. Such conductivity enhancement is observed with polythiophenes and can take place during the preparation of a layer or subsequently. Particularly preferred liquids for such treatment are N-methyl-pyrrolidinone and diethylene glycol such as disclosed in EP-A 686 662 and EP-A 1 003 179.

PEDOT as used in the present disclosure represents poly(3,4-ethylenedioxythiophene).

PSS as used in the present disclosure represents poly(styrene sulphonic acid) or poly(styrenesulphonate).

PET as used in the present disclosure represents poly(ethylene terephthalate).

Flexographic Ink

Aspects of the present invention are realized by a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder, characterized in that the polymer or copolymer of a 3,4-dialkoxythiophene is present in a concentration of at least 0.1% by weight in the flexographic ink and that the flexographic ink is capable of producing a colorimetrically additive transparent print.

According to a first embodiment of the flexographic ink, according to the present invention, the flexographic ink contains at least 0.2% by weight of a polymer or copolymer of a 3,4-dialkoxythiophene in which the two alkoxy groups may be the same or different or together represent an optionally substituted oxy-alkylene-oxy bridge.

According to a second embodiment of the flexographic ink, according to the present invention, the flexographic ink contains at least 0.3% by weight of a polymer or copolymer of a 3,4-dialkoxythiophene in which the two alkoxy groups may be the same or different or together represent an optionally substituted oxy-alkylene-oxy bridge.

According to a third embodiment of the flexographic ink, according to the present invention, the flexographic ink has a viscosity at 25° C. after stirring to constant viscosity of at least 100 mPa.s as measured according to DIN 53211 i.e. until successive measurements according to DIN 53211 are reproducible.

According to a fourth embodiment of the flexographic ink, according to the present invention, the flexographic ink has a viscosity at 25° C. after stirring to constant viscosity of at least 200 mPa.s as measured according to DIN 53211 i.e. until successive measurements according to DIN 53211 are reproducible.

According to a fifth embodiment of the flexographic ink, according to the present invention, the flexographic ink has a viscosity at 25° C. after stirring to constant viscosity of less than 1000 mPa.s as measured according to DIN 53211 i.e. until successive measurements according to DIN 53211 are reproducible.

According to a sixth embodiment of the flexographic ink, according to the present invention, the flexographic ink has a pH between 1.5 and 5.5.

Polymer or Copolymer of a 3,4-dialkoxythiophene

According to a seventh embodiment of the flexographic ink, according to the present invention, the polymer or copolymer of a (3,4-dialkoxythiophene) has the formula

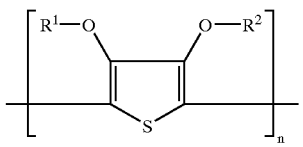

in which, each of $R^1$ and $R^2$ independently represents hydrogen or a $C_{1-5}$-alkyl group or together represent an optionally substituted $C_{1-5}$ alkylene group or a cycloalkylene group.

According to an eighth embodiment of the flexographic ink, according to the present invention, the polymer or copolymer of a (3,4-dialkoxythiophene) is a polymer or copolymer of a (3,4-dialkoxythiophene)in which the two alkoxy groups together represent an optionally substituted oxy-alkylene-oxy bridge.

According to a ninth embodiment of the flexographic ink, according to the present invention, the polymers or copolymers of a (3,4-dialkoxy-thiophenes) are polymers or copolymers of a (3,4-dialkoxy-thiophenes)in which the two alkoxy groups together represent an optionally substituted oxy-alkylene-oxy bridge are selected from the group consisting of: poly(3,4-methylenedioxy-thiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene) and poly(3,4-butylenedioxythiophene) derivatives and copolymers thereof.

According to a tenth embodiment of the flexographic ink, according to the present invention, the polymers or copolymers of a (3,4-dialkoxythiophenes), the substituents for the oxy-alkylene-oxy bridge are alkyl, alkoxy, alkyloxyalkyl, carboxy, alkylsulphonato and carboxy ester groups.

According to an eleventh embodiment of the flexographic ink, according to the present invention, in the poly(3,4-dialkoxythiophenes) the two alkoxy groups together represent an optionally substituted oxy-alkylene-oxy bridge which is a 1,2-ethylene group, an optionally alkyl-substituted methylene group, an optionally $C_{1-12}$-alkyl- or phenyl-substituted 1,2-ethylene group, a 1,3-propylene group or a 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481–494 (2000); L. J. Kloeppner et al. in Polymer Preprints, volume 40(2), page 792 (1999); P. Schottland et al. in Synthetic Metals, volume 101, pages 7–8 (1999); and D. M. Welsh et al. in Polymer Preprints, volume 38(2), page 320 (1997,).

Polyanion

According to an twelfth embodiment of the flexographic ink, according to the present invention, polyanions include the polyanions of polymeric carboxylic acids, e.g. polyacrylic acids, polymethacrylic acids, or polymaleic acids, and polysulphonic acids, e.g. poly(styrene sulphonic acid). These polycarboxylic acids and polysulphonic acids can also be copolymers of vinylcarboxylic acids and vinylsulphonic acids with other polymerizable monomers, e.g. acrylic acid esters, methacrylic acid esters and styrene.

According to a thirteenth embodiment of the flexographic ink, according to the present invention, the polyanion is poly(styrenesulphonate) or a polyanion of a copolymer of poly(styrenesulphonic acid) with styrene.

According to a fourteenth embodiment of the flexographic ink, according to the present invention, the molar ratio of polymer or copolymer of a 3,4-dialkoxythiophene, in which the two alkoxy groups may be the same or different or together represent an optionally substituted oxy-alkylene-oxy bridge, to polyanion is in the range of 1:0.95 to 1:6.5.

According to a fifteenth embodiment of the flexographic ink, according to the present invention, the molar ratio of polymer or copolymer of a 3,4-dialkoxythiophene, in which the two alkoxy groups may be the same or different or together represent an optionally substituted oxy-alkylene-oxy bridge, to polyanion is in the range of 1:0.95 to 1:3.0.

Latex Binder

Aspects of the present invention are realized by a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder.

The suitability of latex binders was assessed by adding 0.1% by weight of the particular binder to a typical dispersion medium for the PEDOT/PSS-containing compositions of the present invention such as 87% by weight of 1,2-propandiol, 9% by weight of diethylene glycol, 3% by weight of deionized water, 0.5% by weight of ZONYL™ FSO and 0.5% by weight of silicone antifoam agent X50860A. A binder which dissolved in such a dispersion medium to the extent of 0.1% by weight was regarded as suitable for the compositions according to the present invention.

According to a sixteenth embodiment of the flexographic ink, according to the present invention, the latex binder is a carboxylated polyolefin or a homo- or co-polymer of a monomer selected from the group consisting of styrene, acrylates, methacrylates, and dienes e.g. isoprene and butadiene.

Suitable latex binders, according to the present invention, are:

| | |
|---|---|
| LATEX01 = | poly(methyl methacrylate) latex with a particle size of 90 nm, available as a 20% by weight aqueous dispersion; |
| LATEX02 = | copolyester latex of 26.5 mol % terephthalic acid, 20 mol % isophthalic acid, 3.5 mol % sulfo-isophthalic acid and 50 mol % ethylene glycol, available as a 20% by weight aqueous dispersion; |
| LATEX03 = | vinylidene chloride, methyl methacrylate, itaconic acid (88/10/2) terpolymer, available as 30% by weight aqueous dispersion; |
| LATEX04 = | a copolymer of 80% ethyl acrylate and 20% methacrylic acid, available as a 27% by weight aqueous dispersion; |
| LATEX05 = | a copolymer of 49% methyl methacrylate, 49% of butadiene and 2% itaconic acid, available as a 30% by weight aqueous dispersion; |
| LATEX06 = | a poly(ethyl acrylate), available as a 30% by weight aqueous dispersion. |
| LATEX07 = | CARBOPOL ™ Aqua 30, a latex of a copolymer of acrylic acid and ethyl acrylate from B. F. Goodrich; |
| LATEX08 = | NEOCRYL ™ BT24, an acrylate-based aqueous latex from Zenica; |
| LATEX09 = | AQUACER ™ 503, an acrylate-based aqueous latex from BYC Cera; |
| LATEX10 = | POLYPHOBE ™ TR117, an acrylate-based aqueous latex from Union Carbide; |

-continued

| | |
|---|---|
| LATEX11 = | AMOREX ™ CR2900, an acrylate-based aqueous latex from Westvaco Corporation; |
| LATEX12 = | CRX-8057-45, an acrylate-based aqueous latex from Westvaco Corporation; |
| LATEX13 = | PRIMAL ™ EP-5380, a 54% by weight acrylate-based aqueous latex from Rohm and Haas; |
| LATEX14 = | JAGOTEX ™ KEM1020, a 58% by weight acrylate-based aqueous latex from Ernst Jager Chem. Rohstoffe GmbH; |
| LATEX15 = | PERMUTEX ™ PS-34 = 320, a 54% by weight acrylate-based aqueous latex from Stahl Holland BV; |
| LATEX16 = | JAGOTEX ™ KEM4009, a 55% by weight acrylate copolymer aqueous latex from Ernst Jager Chem. Rohstoffe GmbH; |
| LATEX17 = | GOOD RITE ™ K797, a 50% by weight acrylic acid-AMPS copolymer aqueous latex from B. F. Goodrich; |
| LATEX18 = | NARLEX ™ DX2020, an acrylic acid/styrene copolymer latex from Alco Chemical; |
| LATEX19 = | ALCOPERSE ™ 725, an acrylic acid/styrene copolymer latex from Alco Chemical; |
| LATEX20 = | CARBOPOL ™ EP2, a 18.1% by weight non-crosslinked methacrylate acid/ethyl acrylate copolymer latex from B. F. Goodrich |
| LATEX21 = | NEOCRYL ™ BT-9, a 40% by weight aqueous polyacrylate latex from ZENICA Resins |
| LATEX22 = | TANACOTE ™ FG3, a 30% by weight aqueous dispersion of a carboxylated polypropylene from SYBRON Chemical Division |

Latexes 7 and 20 have a very strong influence upon the viscosity of the dispersion independent of the PEDOT/PSS-content. LATEX03, LATEX04, LATEX05 and LATEX06 all have glass transition temperatures below 25° C.

Binders can be Newtonian or non-Newtonian as defined above.

Additional Binders

According to a seventeenth embodiment of the flexographic ink, according to the present invention, the flexographic ink further comprises at least one additional binder. Such binders can have a thickening effect on the flexographic ink.

According to an eighteenth embodiment of the flexographic ink, according to the present invention, the flexographic ink further comprises a binder having a glass transition temperature above 25° C.

Suitable additional binders for use in the present invention are described in EP-A 564 911, which is hereby incorporated by reference, and include water-soluble polymers, such as poly(vinyl alcohol), water-soluble homo- and co-polymers of acrylic acid and homo- and co-polymers of methacrylic acid, and latex binders. Suitable additional binders with a thickening effect are polyacrylates and polysaccharides. Preferred polyacrylate thickeners are high molecular weight homo- and copolymers of acrylic acid crosslinked with a polyalkenyl polyether such as the CARBOPOL™ resins of B. F. Goodrich with CARBOPOL™ ETD-2623 being particularly preferred. Preferred polysaccharide thickeners include cellulose, cellulose derivatives e.g. carboxymethyl cellulose, silica, guar gum and xanthan gum, with xanthan gum being particularly preferred e.g. BIOSAN™ S from Hercules Inc., USA and Kelzan™ T from MERCK & Co., Kelco Division, USA.

Particularly preferred additional binders for use in the flexographic ink, according to the present invention, are:

| | |
|---|---|
| ERCOL ™ 48 20 = | a poly(vinyl alcohol) from Acetex Europe |
| CARBOPOL ™ ETD2623 = | an acrylic acid copolymer crosslinked with a polyalkenyl polyether from B. F. Goodrich; |
| CERIDUST ™ 130 = | a polyethylene wax from Hoechst; |
| JONREZ ™ SM700 = | a rosin based resin from Johnson Polymer; |
| JONREZ ™ SM705 = | a rosin based resin from Johnson Polymer; |
| JONREZ ™ SM729 = | a rosin based resin from Johnson Polymer; |
| KLUCEL ™ H = | a hydroxypropylcellulose from Hercules Inc.; |
| NEOCRYL ™ BT24 = | an alkaline-soluble acrylic copolymer from Zenica Resins |

According to a nineteenth embodiment of the flexographic ink, according to the present invention, the flexographic ink further comprises a water-soluble binder selected from the group consisting of: poly(vinyl alcohol), homo- and co-polymers of hydroxyethyl methacrylate, copolymers of 2-propenoic acid 2-(phosphonooxy)ethyl ester and copolymers of 2-methyl-2-propenoic acid 2-(phosphonooxy)ethyl ester.

Newtonian Binders

According to a twentieth embodiment of the flexographic ink, according to the present invention, the flexographic ink contains a Newtonian binder, see above definition. This Newtonian binder may be the latex binder or an additional binder.

Addition of the Newtonian binder to the aqueous composition, according to the present invention, may improve the coating quality on non-planar structures. Such binders may also increase the viscosity of aqueous solutions, but not substantially.

According to a twenty-first embodiment of the flexographic ink, according to the present invention, the flexographic ink contains a Newtonian binder selected from the group consisting of polyacrylates, carboxymethylcellulose, polyvinylpyrrolidone, hydroxyethylcellulose (e.g. TYLOSE™ H4000P), hydroxypropyl-cellulose (e.g. KLUCEL™ H from Hercules), carboxylate-containing copolymers with sulphonic acid groups, hydroxy-modified acrylic acid copolymers and poly(vinyl alcohol).

Suitable Newtonian binders are:

| Non-Newtonian binders | |
|---|---|
| MIROX ™ TBN = | a 20% by weight aqueous solution of a copolymer of sodium acrylate and NP 14-methacrylate by Stockhausen GmbH, Krefeld, Germany; |
| LATEX 21 = | Neocryl ™ BT-9, a 40% by weight aqueous polyacrylate latex from ZENICA Resins; |
| LATEX 22 = | Tanacote ™ FG3, a 30% by weight aqueous dispersion of a carboxylated polypropylene from SYBRON Chemical Division |

According to an twenty-second embodiment of the flexographic ink, according to the present invention, the flexographic ink contains a non-Newtonian binder. This non-Newtonian binder may be the latex binder or an additional binder.

Non-Newtonian binders bind the ingredients of the electroconductive layers together and substantially increase the viscosity of aqueous solutions at concentrations by weight of less than 2%.

Polyacrylates and polysaccharides exhibiting non-Newtonian behaviour in aqueous solution are suitable non-Newtonian binders for use in the aqueous compositions according to the present invention. Polysaccharides which substantially increase the viscosity of aqueous solutions include cellulose, cellulose derivatives, e.g. carboxymethyl cellulose, guar gum and xanthan gum.

The difference in rheological behaviour for non-Newtonian and Newtonian binders is evident from the dependence of the viscosity of their solutions upon shear rate. Table 1 gives the viscosity as a function of shear rate determined using an AR1000 plate and cone rheometer (diameter 4 cm; cone angle 2°) at 20° C. with increasing shear rate for 1% by weight solutions of CARBOPOL™ ETD 2623, a non-Newtonian polyacrylate binder, 0.2% by weight solutions of the copolymer of sodium polyacrylate and NP 14-methacrylate in MIROX™ TBN, a Newtonian polyacrylate binder, at different pH's and 2% by weight solutions of MIROX™ TBN in Table 1.

TABLE 1

| | Viscosity [mPa.s] at 20° C. | | | |
|---|---|---|---|---|
| | 1% by weight CARBOPOL ™ ETD 2623 solution in water | | ag. solution of copolymer of sodium polyacrylate & NP 14-methacrylate in MIROX ™ TBN | |
| Shear rate [s$^{-1}$] | pH = 3.2 | pH = 5.2 | 0.2% by weight pH = 8.0 | 2% by weight pH = 7.2 |
| 0.10 | | | | 375.9 |
| 0.25 | | | | 365.8 |
| 0.40 | | | | 363.0 |
| 0.63 | | | | 358.9 |
| 1.00 | | | | 357.0 |
| 1.18 | | | 4.9 | |
| 1.20 | 7897 | 68620 | | |
| 1.59 | | | | 353.9 |
| 2.30 | | | 4.8 | |
| 2.38 | 3296 | 42610 | | |
| 2.51 | | | | 349.8 |
| 3.98 | | | | 346.2 |
| 4.67 | | | 4.8 | |
| 4.75 | | 26710 | | |
| 4.76 | 1520 | | | |
| 5.89 | | | | 372.0 |
| 7.29 | | | 4.9 | |
| 7.54 | 994.2 | 19530 | | |
| 10.0 | | | | 352.8 |
| 14.95 | | | 4.7 | |
| 15.04 | 565.9 | 12070 | | |
| 15.85 | | | | 372.0 |
| 25.12 | | | | 394.9 |
| 30.00 | 337.5 | 7554 | | |
| 30.21 | | | 4.7 | |
| 39.81 | | | | 396.6 |
| 63.10 | | | | 365.7 |
| 75.36 | 177.4 | 4180 | | |
| 77.15 | | | 4.6 | |

Non-Newtonian binders for use in the present invention include high molecular weight homo- and copolymers of acrylic acid crosslinked with a polyalkenyl polyether, such as the CARBOPOL™ resins of B. F. Goodrich e.g. CARBOPOL™ ETD 2623, and xanthan gum, e.g. BIOSAN™ S from Hercules Inc., USA and Kelzan™ T from MERCK & Co., Kelco Division, USA.

According to a twenty-third embodiment of the flexographic ink, according to the present invention, the flexographic ink further contains a non-Newtonian binder which is selected from the group consisting of polyacrylates and polysaccharides.

According to a twenty-fourth embodiment of the flexographic ink, according to the present invention, the flexographic ink further contains a non-Newtonian binder which is a homopolymer or copolymer of acrylic acid crosslinked with a polyalkenyl polyether.

Organic Solvents

According to a twenty-fifth embodiment of the flexographic ink, according to the present invention, the flexographic ink further contains an organic solvent.

According to a twenty-sixth embodiment of the flexographic ink, according to the present invention, the flexographic ink further contains a water-miscible organic solvent.

According to a twenty-seventh embodiment of the flexographic ink, according to the present invention, the flexographic ink further contains a water-miscible organic solvent which is selected from the group consisting of aliphatic alcohols, ketones, arenes, esters, glycol ethers, cyclic ethers, such as tetrahydrofuran, and their mixtures.

The presence of certain organic solvents in layers containing polymers or copolymers of a 3,4-dialkoxythiophene in which the two alkoxy groups may be the same or different or together represent an optionally substituted oxy-alkylene-oxy bridge together with a subsequent heat treatment enhances the conductivity of the layers as disclosed in EP-A 686 662 and EP-A 1 003 179, herein included by reference.

According to a twenty-eighth embodiment of the flexographic ink, according to the present invention, the flexographic ink further contains a di- or polyhydroxy- and/or carboxy groups or amide or lactam group containing organic compound, for example diethylene glycol, 1,2-propandiol, glycerol, hexylene glycol, propylene glycol, di(ethylene glycol)ethyl ether acetate (carbitol™ acetate), N-methylacetamide, N-methyl pyrrolidinone and sugar alcohols, such as sorbitol, mannitol, saccharose and fructose.

According to a twenty-ninth embodiment of the flexographic ink, according to the present invention, the flexographic ink further contains an aprotic compound with a dielectric constant ≧15, such as N-methyl pyrrolidinone, 2-pyrrolidinone, 1,3-dimethyl-2-imidazolidone, N,N,N',N'-tetramethylurea, formamide, N,N-dimethylformamide, N,N-dimethylacetamide, tetramethylene sulphone, dimethyl sulphoxide and hexamethylphosphoramide.

According to a thirtieth embodiment of the flexographic ink, according to the present invention, the flexographic ink further contains a di- or polyhydroxy- and/or carboxy groups or amide or lactam group containing organic compound selected from the group consisting of 1,2-propandiol, propylene glycol, diethylene glycol, N-methyl pyrrolidinone and di(ethylene glycol)ethyl ether acetate (carbitol™ acetate).

The suitability of particular non-aqueous solvents can be evaluated by mixing 8 g of a 1.2% by weight aqueous dispersion of PEDOT/PSS with 12 g of solvent. If miscibility is observed without gel formation, the non-aqueous solvent is regarded as suitable. Tetrahydrofuran is miscible, but the dispersions are very viscous. Suitability according to the above miscibility test does not rule out phase separation upon further dilution of the PEDOT/PSS-dispersion with the same solvent, as is observed with tetrahydrofuran. It will be understood by one skilled in the art that a PEDOT/PSS-dispersion cannot be diluted to an unlimited extent without the possibility of phase separation.

Ethyl lactate induces gel-formation and hence is unsuitable. Benzyl alcohol, furfuryl alcohol and cyclohexane produced phase separation and hence are unsuitable.

Pigments

According to a thirty-first embodiment of the flexographic ink, according to the present invention, the flexographic ink further contains a pigment.

Transparent coloured compositions can be realized by incorporating pigments e.g. azo pigments e.g. DALMAR™ Azo Yellow and LEVANYL™ Yellow HRLF, dioxazine pigments e.g. LEVANYL™ Violet BNZ, phthalocyanine blue pigments, phthalocyanine green pigments, Molybdate Orange pigments, Chrome Yellow pigments, Quinacridone pigments, barium precipitated Permanent Red 2B, manganese precipitated BON Red, Rhodamine B pigments and Rhodamine Y pigments.

Suitable pigments according to the present invention are:

| Pigment nr. | Pigment | Manufacturer | |
|---|---|---|---|
| PIG01 | LEVANYL™ VIOLET BNZ as an aqueous paste | BAYER | 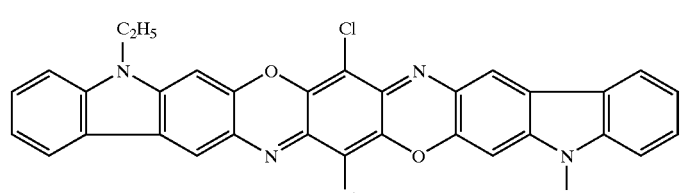 |
| PIG02 | LEVANYL™ Yellow HRLF as an aqueous paste | BAYER | 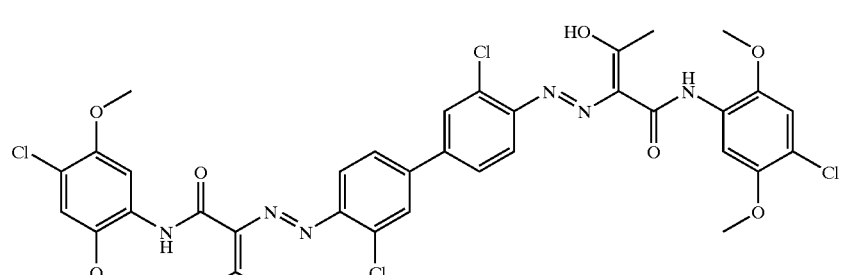 |
| PIG03 | FLEXONYL™ Blue B2G as an aqueous paste | CLARIANT | 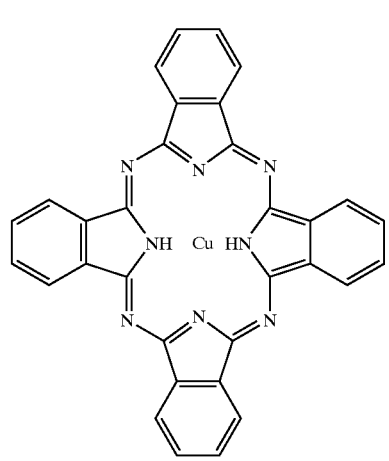 |
| PIG04 | LEVANYL™ RED BBZ as an aqueous paste | BAYER | 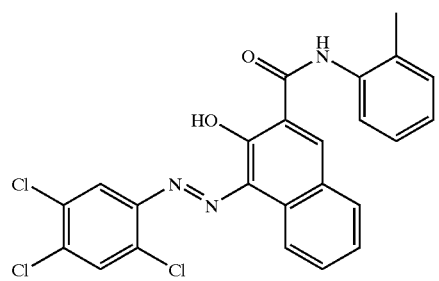 |

-continued
| Pigment nr. | Pigment | Manufacturer | |
|---|---|---|---|
| PIG05 | LEVANYL™ BLUE GZ as an aqueous paste | BAYER | 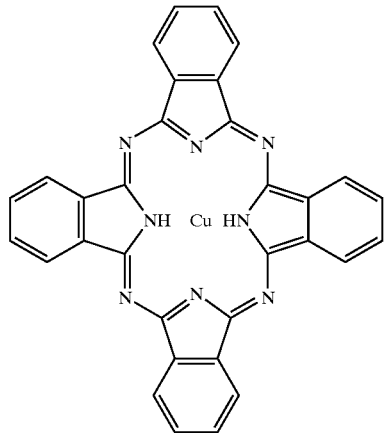 |
| PIG06 | NOVOPERM™ Yellow HR02 as a aqueous paste | CLARIANT | 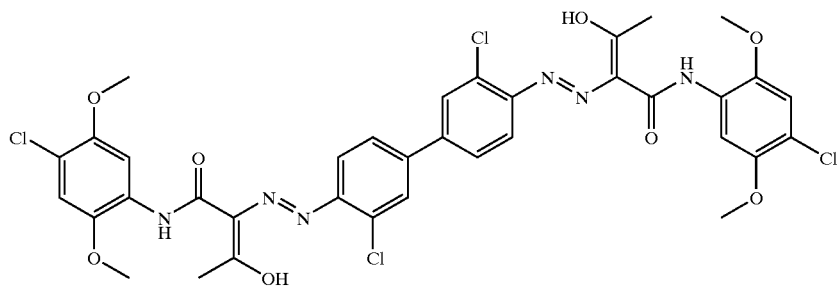 |
| PIG07 | LEVANYL™ Blue G-LF as an aqueous paste | BAYER | 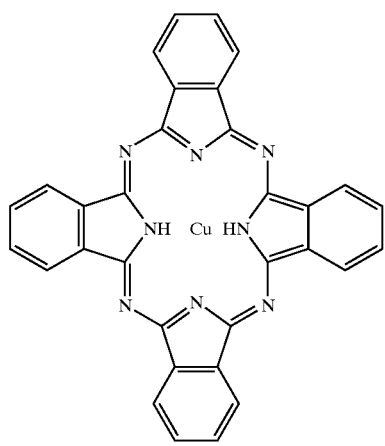 |

| Pigment nr. | Pigment | Manufacturer | |
|---|---|---|---|
| PIG08 | HOSTAPERM™ Blue B2G as an aqueous paste | CLARIANT | 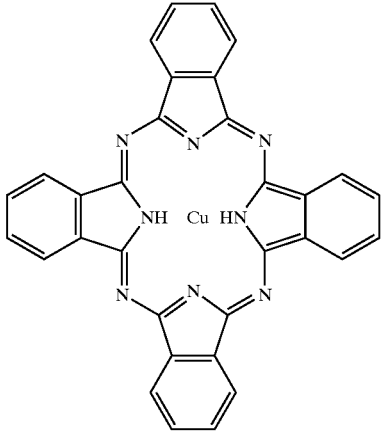 |
| PIG09 | HOSTAPERM™ Blue B2G-L as an aqueous paste | CLARIANT | 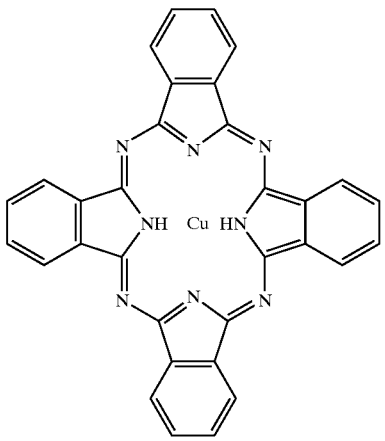 |

Crosslinking Agents

According to a thirty-second embodiment of the flexographic ink, according to the present invention, the flexographic ink further contains a cross-linking agent. Suitable cross-linking agents are epoxysilane (e.g. 3-glycidoxypropyltrimethoxysilane), hydrolysis products of silanes (e.g. hydrolysis products of tetraethyoxysilane or tetramethoxysilane) as disclosed in EP 564 911, herein incorporated by reference, and di- or oligo-isocyanates optionally in blocked form.

Anti-foaming Agents

According to a thirty-third embodiment of the flexographic ink, according to the present invention, the flexographic ink further contains an anti-foaming agent.

A suitable anti-foaming agent is the silicone antifoam agent X50860A from Shin-Etsu.

Surfactants

According to a thirty-fourth embodiment of the flexographic ink, according to the present invention, the flexographic ink further contains a surfactant.

According to a thirty-fifth embodiment of the flexographic ink, according to the present invention, the flexographic ink further contains a non-ionic surfactant e.g. ethoxylated/fluroralkyl surfactants, polyethoxylated silicone surfactants, polysiloxane/polyether surfactants, ammonium salts of perfluro-alkylcarboxylic acids, polyethoxylated surfactants and fluorine-containing surfactants.

Suitable non-ionic surfactants are:

| NON01 | SURFYNOL™ 440 | a di(polyethylene oxide)-substituted alkyne from Air Products; |
|---|---|---|
| NON02 | SYNPERONIC™ 13/6.55 | a tridecylpolyethylene-glycol from UNIQEMA; |
| NON03 | ZONYL™ FSO-100: | a mixture of ethoxylated fluoro-surfactants with the formula: $F(CF_2CF_2)_{1-7}CH_2CH_2O(CH_2CH_2O)_yH$ where y = 0 to ca. 15 from DuPont; |
| NON04 | ARKOPAL™ N060 | a nonylphenylpolyethylene-glycol from HOECHST |
| NON05 | FLUORAD™ FC129 | a fluoroaliphatic polymeric ester from 3M |
| NON06 | PLURONIC™ L35 | a polyethylene-glycol/propylene-glycol from BASF |
| NON07 | Tegoglide™ 410: | a polysiloxane-polymer copolymer surfactant, from Goldschmidt; |
| NON08 | Tegowet™: | a polysiloxane-polyester copolymer surfactant, from Goldschmidt; |

-continued

| | | |
|---|---|---|
| NON09 | FLUORAD ™ FC126: | a mixture of ammonium salts of perfluorocarboxylic acids, from 3M; |
| NON10 | FLUORAD ™ FC430: | a 98.5% active fluoroaliphatic ester from 3M; |
| NON11 | FLUORAD ™ FC431: | $CF_3(CF_2)_7SO_2(C_2H_5)N$—$CH_2CO$—$(OCH_2CH_2)_nOH$ from 3M; |
| NON12 | | Polyoxyethylene-10-lauryl ether |
| NON13 | ZONYL ™ FSN: | a 40% by weight solution of $F(CF_2CF_2)_{1-9}CH_2CH_2O(CH_2CH_2O)_xH$ in a 50% by weight solution of iso-propanol in water where x = 0 to about 25, from DuPont; |
| NON14 | ZONYL ™ FSN-100: | $F(CF_2CF_2)_{1-9}CH_2CH_2O(CH_2CH_2O)_xH$ where x = 0 to about 25, from DuPont; |
| NON15 | ZONYL ™ FS300: | a 40% by weight aqueous solution of a fluorinated surfactant, from Dupont; |

-continued

| | | |
|---|---|---|
| NON16 | ZONYL ™ FSO: | a 50% by weight solution of a mixture of ethoxylated fluorosurfactants with the formula: $F(CF_2CF_2)_{1-7}CH_2CH_2O(CH_2CH_2O)_yH$ where y = 0 to ca. 15 in a 50% by weight solution of ethylene glycol in water, from DuPont; |

According to a thirty-sixth embodiment of the flexographic ink, according to the present invention, the flexographic ink further contains an anionic surfactant. Suitable anionic surfactants are:

| | | |
|---|---|---|
| AN01 | HOSTAPON ™ T | a 95% concentrate of purified sodium salt of N-methyl-N-2-sulfoethyl-oleylamide, from HOECHST |
| AN02 | LOMAR ™ D | 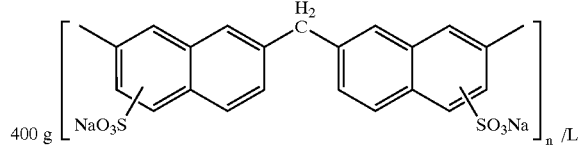 |
| AN03 | AEROSOL ™ OT | an aqueous solution of 10 g/L of the sodium salt of the di-2-ethylhexyl ester of sulphosuccinic acid from American Cyanamid |
| AN04 | DOWFAX ™ 2A1 | a 45% by weight aqueous solution of a mixture of the sodium salt of bis (p-dodecyl, sulpho-phenyl)-ether and the sodium salt of (p-dodecyl, sulpho-phenyl)(sulpho-phenyl)ether from Dow Corning |
| AN05 | FT 248 | an aqueous solution of 49.5 g/L tetraethylammonium perfluoro-octylsulphonate from BAYER |
| AN06 | NIAPROOF ANIONIC ™ 4 | an aqueous solution of 50 mL/L sodium 1-isobutyl, 4-ethyl-n-octylsulphate from Niacet; |
| AN07 | ZONYL ™ 7950: | a fluorinated surfactant, from DuPont; |
| AN08 | ZONYL ™ FSA: | 25% by weight solution of $F(CF_2CF_2)_{1-9}CH_2CH_2SCH_2CH_2COOLi$ in a 50% by weight solution of isopropanol in water, from DuPont; |
| AN09 | ZONYL ™ FSE: | 14% by weight solution of $[F(CF_2CF_2)_{1-7}CH_2CH_2O]_xP(O)(ONH_4)_y$ where x = 1 or 2; y = 2 or 1; and x + y = 3 in a 70% by weight solution of ethylene glycol in water, from DuPont; |
| AN10 | ZONYL ™ FSJ: | 40% by weight solution of a blend of $F(CF_2CF_2)_{1-7}CH_2CH_2O]_xP(O)(ONH_4)_y$ where x = 1 or 2; y = 2 or 1; and x + y = 3 with a hydrocarbon surfactant in 25% by weight solution of isopropanol in water, from DuPont; |
| AN11 | ZONYL ™ FSP | 35% by weight solution of $[F(CF_2CF_2)_{1-7}CH_2CH_2O]_xP(O)(ONH_4)_y$ where x = 1 or 2; y = 2 or 1 and x + y = 3 in 69.2% by weight solution of isopropanol in water, from DuPont; |
| AN12 | ZONYL ™ UR: | $[F(CF_2CF_2)_{1-7}CH_2CH_2O]_xP(O)(OH)_y$ where x = 1 or 2; y = 2 or 1 and x + y = 3, from DuPont; |
| AN13 | ZONYL ™ TBS: | 33% by weight solution of $F(CF_2CF_2)_{3-8}CH_2CH_2SO_3H$ in a 4.5% by weight solution of acetic acid in water, from DuPont; |
| AN14 | FLUORAD ™ FX-1006 | ammonium salt of perfluoro-octanoic acid, from 3M. |

According to a thirty-seventh embodiment of the flexographic ink, according to the present invention, the flexographic ink further contains an amphoteric surfactant. Suitable amphoteric surfactants are:

| | | |
|---|---|---|
| AMP01 | AMBITERIC H: | a 20% by weight solution of hexadecyldimethylammonium acetic acid in ethanol |

Further Additives

According to a thirty-eighth embodiment of the flexographic ink, according to the present invention, the flexographic ink further contains a wax. Wax improves the scuff, rub and abrasion resistance of the prints. Particularly suitable waxes are polyethylene wax, polyethylene oxide wax, polypropylene wax and fatty amides.

According to a thirty-ninth embodiment of the flexographic ink, according to the present invention, the flexographic ink further contains a silicone. Silicone increases slip on packaging lines.

According to a fortieth embodiment of the flexographic ink, according to the present invention, the flexographic ink further contains silica. Silica reduces slip on heavy duty sacks that must stack safely.

According to a forty-first embodiment of the flexographic ink, according to the present invention, the flexographic ink further contains a plasticizer. Plasticizers increase flexibility of the ink film and thus assist in maintaining adhesion.

Method for Preparing a Flexographic Ink

Aspects of the present invention are also realized by a method for preparing a non-dye containing flexographic ink, containing at least 0.1% by weight of a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium and having a viscosity at 25° C. after stirring to constant viscosity of at least 130 mPa.s as measured according to DIN 53211, comprising the steps of: i) concentrating an aqueous dispersion of the polymer or copolymer of (3,4-dialkoxythiophene) and the polyanion; and ii) adding the latex binder.

According to a first embodiment of the method, according to the present invention, the method further comprises the step of adding at least one the di- or polyhydroxy- and/or carboxy groups or amide or lactam group containing organic compound for example sugar alcohols, such as sorbitol, mannitol, saccharose and fructose, diethylene glycol, 1,2-propandiol, propylene glycol N-ethyl pyrrolidinone and conductive coatings therefrom which are tempered to increase their resistance preferably to <300 ohm/square as disclosed in EP-A 686 662, hereby incorporated by reference.

According to a second embodiment of the method, according to the present invention, the method further comprises the step of adding a non-aqueous solvent.

According to a third embodiment of the method, according to the present invention, the step of concentrating the aqueous dispersion of a polymer or copolymer of (3,4-dialkoxythiophene) and the polyanion is carried out by evaporation of water, evaporation of water after addition of at least one organic solvent or evaporation of water by freeze drying.

According to a fourth embodiment of the method, according to the present invention, the method further comprises the step of adding a pigment.

Evaporation of Water After Addition of at Least One Organic Solvent

According to a fifth embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 65% by weight.

According to a sixth embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 70% by weight.

According to a seventh-embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 80% by weight.

According to an eighth embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 90% by weight.

According to a ninth embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 95% by weight.

According to a tenth embodiment of the method, according to the present invention, in the concentration of the aqueous polymer or copolymer of (3,4-dialkoxythiophene) and the polyanion the evaporation of water after addition of at least one organic solvent proceeds until the content of water therein is reduced by at least 99% by weight.

According to an eleventh embodiment of the method, according to the present invention, in the concentration of the aqueous polymer or copolymer of (3,4-dialkoxythiophene) and the polyanion the evaporation of water after addition of at least one organic solvent at least 30% by weight of the flexographic ink is non-aqueous solvent.

According to a twelfth embodiment of the method, according to the present invention, in the concentration of the aqueous polymer or copolymer of (3,4-dialkoxythiophene) and the polyanion the evaporation of water after addition of at least one organic solvent at least 65% by weight of the flexographic ink is non-aqueous solvent.

According to a thirteenth embodiment of the method, according to the present invention, in the concentration of the aqueous polymer or copolymer of (3,4-dialkoxythiophene) and the polyanion the evaporation of water after addition of at least one organic solvent at least 80% by weight of the flexographic ink is non-aqueous solvent.

In general the degree to which water can be removed in the process, according to the present invention, will depend upon the ability of the water to diffuse through the dispersion to the surface, which is dependent upon the viscosity of the PEDOT/PSS-dispersion under the evaporation conditions. However, the viscosity of PEDOT/PSS-dispersions is strongly dependent upon the PEDOT/PSS-content in the final dispersion. Water-contents of 1 to 5% by weight can be easily realized with dispersions of 0.8% by weight PEDOT/PSS with a weight ratio of PEDOT to PSS of 1:2.4, but just increasing the content of PEDOT/PSS, with a weight ratio of PEDOT to PSS of 1:2.4, to 1.0% by weight has such a strong influence on the viscosity of the dispersion that the easily realisable water-content increases to 10 to 15% by weight.

It should be pointed out that the viscoelastic properties of the PEDOT/PSS-dispersions obtained with the method, according to the present invention, are stable upon storage under ambient conditions.

Evaporation of Water by Freeze Drying

According to a fourteenth embodiment of the method, according to the present invention, wherein in the concentration of the aqueous polymer or copolymer of (3,4-dialkoxythiophene) and the polyanion the evaporation of water by freeze drying a redispersible or soluble product is prepared as a dry product or as a paste.

The first step in freeze drying a product is to convert it into a frozen state. During the freezing process the solvent (water) is preferably crystallized. The formation of ice crystals results in a separation of the solutes and the solvent. Then the ice crystals are removed by sublimation under vacuum conditions. While the sublimation or primary drying process removes most of the water from the frozen matrix, there can still be greater than 5% moisture weight/weight with respect to the freeze-dried product in the cake. Thereafter the remaining water is removed by desorption. It has been found that the water content of the freeze-dried product, according to the present invention, has a strong effect on the redispersibility thereof. The products are highly hygroscopic. For example, the weight of PEDOT/PSS obtained by drying a 1.2% by weight aqueous dispersion at 102° C. increased by 16 to 23% at room temperature, whereas the weight increase in an exicator was only 8%. Products freeze-dried at room temperature, according to the present invention, typically have a water content of 15 to 20% by weight. Further drying of the freeze-dried product in a vacuum drying cupboard at 110° C. and a drying cupboard at 110° C. results in products, which are more difficult to disperse.

The redispersible or soluble product prepared by freeze drying is a dry, spongy, woolly powder or a paste. A paste can be obtained instead of a powder by incomplete freeze drying of the aqueous dispersion. The redispersible or soluble product as a powder or paste can be dissolved or redispersed by adding water, organic solvent or mixtures of water/solvent optionally with other ingredients such as surfactants and dispersants.

According to a fifteenth embodiment of the method, according to the present invention, wherein in the concentration of the aqueous polymer or copolymer of (3,4-dialkoxythiophene) and the polyanion the evaporation of water by freeze drying a redispersible or soluble product is prepared, which is a concentrated dispersion or a paste with a solids content higher than 10% by weight.

According to a sixteenth embodiment of the method, according to the present invention, wherein in the concentration of the aqueous polymer or copolymer of (3,4-dialkoxythiophene) and the polyanion the evaporation of water by freeze drying a redispersible or soluble product is prepared, which is a concentrated dispersion or a paste with a solids content higher than 20% by weight.

According to a seventeenth embodiment of the method, according to the present invention, wherein in the concentration of the is aqueous polymer or copolymer of (3,4-dialkoxythiophene) and the polyanion the evaporation of water by freeze drying a redispersible or soluble product is prepared, which is a concentrated dispersion or a paste with a solids content higher than 50% by weight.

A concentrated dispersion in an organic solvent such as diethylene glycol or N-methyl-pyrrolidinone, can, for example, be realized by freeze drying a mixture of the organic solvent and the aqueous dispersion or solution of polythiophene/polyanion to a dispersion of polythiophene/polyanion in the organic solvent.

This concentrated dispersion or paste can be diluted or redispersed to obtain any desired concentration in a similar manner to the powder.

Flexographic Printing Process

Aspects of the present invention are realized by a printing process comprising the steps of: providing a non-dye containing flexographic ink containing at least 0.1% by weight of a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium and a viscosity at 25° C. after stirring to constant viscosity of at least 130 mPa.s as measured according to DIN 53211; and printing ink the printing ink on an optionally subbed substrate thereby producing a colorimetrically additive transparent print.

According to a first embodiment of the printing process according to the present invention, the substrate is a flexible substrate. According to a second embodiment of the printing process according to the present invention, the substrate is paper, polymer film, glass or ceramic.

A substrate may be translucent, transparent or opaque. It may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate) or poly(ethylene naphthalene-1,4-dicarboxylate) being particularly preferred.

Industrial Application

The flexographic ink according to the present invention can, for example, be used to apply antistatic and electro-conductive patterns to an optionally subbed support, a dielectric layer, a phosphor layer and a transparent conductive layer. This can, for example, be a step in the production of electrical circuitry for single and limited use items such as toys, in capacitive antennae as part of radiofrequency tags, in electroluminescent devices which can be used in lamps, displays, back-lights e.g. LCD, automobile dashboard and keyswitch backlighting, emergency lighting, cellular phones, personal digital assistants, home electronics, indicator lamps and other applications in which light emission is required.

The invention is illustrated hereinafter by way of COMPARATIVE EXAMPLES and INVENTION EXAMPLES.

The percentages and ratios given in these examples are by weight unless otherwise indicated.

The following substrates were used in the COMPARATIVE and INVENTION EXAMPLES:

| substrate nr | |
|---|---|
| 1 | PET with subbing layer 1 |
| 2 | polyethylene (RC) coated paper, roll nr. GM 279 |
| 3 | cellulose triacetate film |
| 4 | transparent 100 μm thick PVC-foil, roll nr. 107 × 08 from Staufen |
| 5 | TRANSPAREX ™ T787 film from AGFA-GEVAERT N.V. |
| 6 | AUTOSTAT ™ CT7: a 175 μm thick heat-stabilized poly(ethylene terephthalate) [PET] subbed on both sides supplied by AUTOTYPE INTERNATIONAL LTD |
| 7 | copy paper: SYMBIO ™ BRONZE GRAPHICS (80 g/m²) from SYMBIOPAPER |
| 8 | coated paper: ALLEGRO ™ GLOSS (115 g/m²) |

Subbing layer Nr. 01 has the composition:

| | |
|---|---|
| copolymer of 88% vinylidene chloride, 10% methyl acrylate and 2% itaconic acid | 79.1% |
| Kieselsol ™ 100F, a colloidal silica from BAYER | 18.6% |
| Mersolat ™ H, a surfactant from BAYER | 0.4% |
| Ultravon ™ W, a surfactant from CIBA-GEIGY | 1.9% |

The following not previously mentioned ingredients were used in the COMPARATIVE and INVENTION EXAMPLES:

anti-foaming agent:

| X-50-860A = | X-50-860A, a silicone defoaming agent from Shin-Etsu |
|---|---| liquids:

| DW = | deionized water |
|---|---|
| PD = | 1,2-propandiol (189° C.) |
| DEG = | diethylene glycol (245° C.) |
| DEG-MME = | diethylene glycol monomethyl ether (193° C.) | dyes:

Acid Yellow 23 (Tartraphenine) (from Clariant, Germany) =

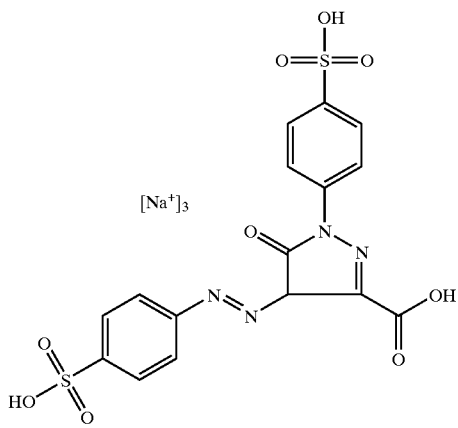

Reactive Red 180 (from Aakash, USA) =

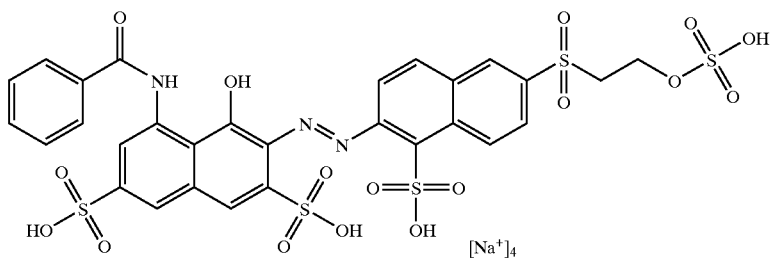

| Direct Yellow 86 (from Farbenchem, Germany) = | 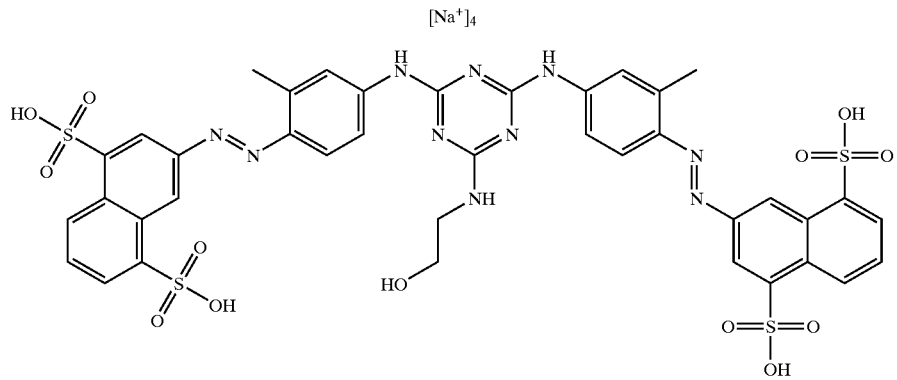 |
|---|---|
| Direct Blue 199 (from Farbenchem, Germany) = | 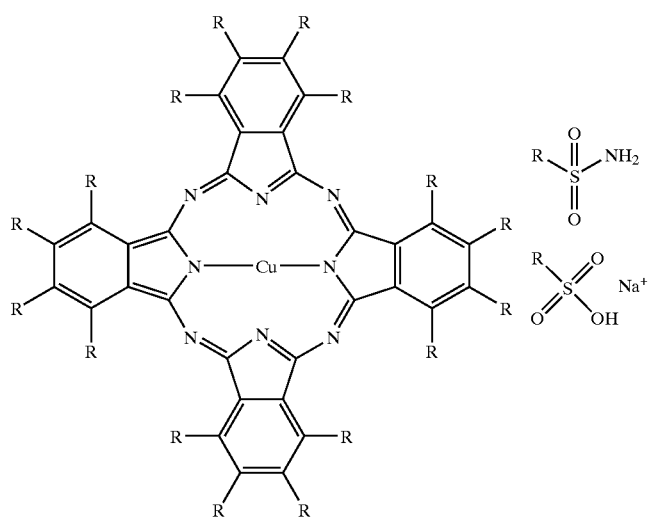 |

Aqueous PEDOT/PSS Dispersion

The starting material for the preparation of the flexographic inks described in the INVENTION EXAMPLES was a 1.2% by weight aqueous dispersion of PEDOT/PSS containing a weight ratio PEDOT to PSS of 1:2.4 prepared as disclosed in EP-A 440 957 and having a typical viscosity measured using an AR1000 plate and cone rheometer (diameter 4 cm; cone angle 2°) at 20° C. of 38 mPa.s at a shear rate of 5 s$^{-1}$ decreasing to 33.5 mPa.s at a shear rate of 35 mPa.s and has a typical pH of 1.9. A 3% by weight dispersion of PEDOT/PSS was then prepared from this 1.2% by weight dispersion by evaporating 60.7% by weight of the water with stirring at a temperature of 75° C. and a pressure of 50 mbar.

COMPARATIVE EXAMPLES 1 to 7

The flexographic inks of COMPARATIVE EXAMPLES 1 to 7 were prepared by adding with mixing the ingredients in the quantities given in Table 1 to 45 g of a 3% by weight dispersion of PEDOT/PSS in water after mixing with the deionized water.

TABLE 1

| | Comparative Example nr | | | | | | |
|---|---|---|---|---|---|---|---|
| | 1 | 2 | 3 | 4 | 5 | 6 | 7 |
| 1.14 wt % aq. PEDOT/PSS disp. [g] | 81.0 | 81.0 | 81.0 | 81.0 | 81.0 | 81.0 | 81.0 |
| CARBOPOL ™ ETD2623 [g] | 0.6 | 0.6 | 0.6 | 0.6 | 0.6 | 0.6 | 0.6 |
| LATEX14 [g] | 1.8 | 1.8 | 1.8 | 1.8 | 1.8 | 1.8 | 1.8 |
| LATEX22 [g] | 1.4 | 1.4 | 1.4 | 1.4 | 1.4 | 1.4 | 1.4 |
| PD [g] | 2.5 | 2.5 | 2.5 | 2.5 | 2.5 | 2.5 | 2.5 |
| DEG-MME [g] | 4.5 | 4.5 | 4.5 | 4.5 | 4.5 | 4.5 | 4.5 |
| DEG [g] | 7.0 | 7.0 | 7.0 | 7.0 | 7.0 | 7.0 | 7.0 |
| SURFYNOL ™ 440 [g] | 0.7 | 0.7 | 0.7 | 0.7 | 0.7 | 0.7 | 0.7 |
| X-50-860A [g] | 0.1 | 0.1 | 0.1 | 0.1 | 0.1 | 0.1 | 0.1 |
| Isopropanol [g] | 10 | 10 | 10 | 10 | 10 | 10 | 10 |
| Acid Yellow 23 [g] | 0.1 | — | — | — | — | — | — |
| Direct Yellow 86 [g] | — | 0.1 | — | — | — | — | — |
| Reactive Red 180 [g] | — | — | 0.1 | — | — | — | — |
| Direct Blue 199 [g] | — | — | — | 0.1 | 0.6 | 1.1 | 2.0 |
| Total [g]: | 99.7 | 99.7 | 99.7 | 99.7 | 100.2 | 100.7 | 101.6 |
| wt % water in aq. medium | 81.0 | 81.0 | 81.0 | 81.0 | 80.6 | 80.2 | 79.5 |
| Viscosity [mPa.s] | 680 | 700 | 690 | 720 | 750 | 760 | 750 |

The colorants: Acid Yellow 23, Direct Yellow 86, Reactive Red 180 and Direct Blue 199 all had solubilities in water at 25° C. above 10 g/L and hence are classified, according to the present invention, as dyes. Increasing the dye concentration did not produce a proportional increase in optical density in the print and the surface resistance increased disproportionately with an increase in dye concentration. Furthermore, the mottle and graininess of the print also increased with increasing dye concentration in the ink. Flocking of the PEDOT/PSS was observed which may include displacement of PSS in PEDOT/PSS by these anionic dyes.

Flexographic Printing

The flexographic inks of INVENTION EXAMPLES 1 to 6 were printed using a RK Esiproof handtester from RK Print Coat Instruments Ltd, UK provided with a 140 cells/inch chrome-plated anilox drum.

The compositions of the printed layers are given in Table 2, together with the surface resistance of the layers and their optical densities as determined using a MacBeth™ RD918 SB with the colour filters given with the optical density values in Table 2.

TABLE 2

| | Comparative Example nr | | | | | | |
|---|---|---|---|---|---|---|---|
| | 1 | 2 | 3 | 4 | 5 | 6 | 7 |
| wt % PEDOT/PSS | 23.7 | 23.7 | 23.7 | 23.7 | 21.0 | 18.0 | 15.9 |
| wt % binder | 53.1 | 53.1 | 53.1 | 53.1 | 47.0 | 42.2 | 35.6 |
| wt % dye | 2.6 | 2.6 | 2.6 | 2.6 | 13.7 | 22.5 | 34.6 |
| wt % SURFYNOL ™ 440 | 18.0 | 18.0 | 18.0 | 18.0 | 16.0 | 14.3 | 12.1 |
| wt % X-50-860A | 2.6 | 2.6 | 2.6 | 2.6 | 2.3 | 2.1 | 1.7 |
| Surface resistance [kΩ/square] | 7.2 | 11.0 | 8.1 | 14 | 63 | 1400 | non-conductive |
| OD [Macbeth ™ RD918SB] | 0.16 [$D_{blue}$] | 0.18 [$D_{blue}$] | 0.12 [$D_{red}$] | 0.23 [$D_{red}$] | 0.41 [$D_{red}$] | 0.69 [$D_{red}$] | 0.8 [$D_{red}$] |

INVENTION EXAMPLES 1 to 6

The flexographic inks of INVENTION EXAMPLES 1 to 6 were prepared by adding with mixing the ingredients in the quantities given in Table 3 to 45 g of a 3% by weight dispersion of PEDOT/PSS in water after mixing with the deionized water.

TABLE 3

| | Invention Example nr | | | | | |
|---|---|---|---|---|---|---|
| | 1 | 2 | 3 | 4 | 5 | 6 |
| 3 wt % aq. disp. PEDOT/PSS [g] | 45 | 45 | 45 | 45 | 45 | 45 |
| DW [g] | 23.4 | 23.4 | 23.1 | 25.1 | 23.1 | 24.1 |
| LATEX14 [g] | 1.8 | 1.8 | 1.8 | 1.8 | 1.8 | 1.8 |
| LATEX22 [g] | 1.4 | 1.4 | 1.4 | 1.4 | 1.4 | 1.4 |
| PD [g] | 2.5 | 2.5 | 2.5 | 2.5 | 2.5 | 2.5 |
| DEG-MME [g] | 4.5 | 4.5 | 4.5 | 4.5 | 4.5 | 4.5 |
| DEG [g] | 7.0 | 7.0 | 7.0 | 7.0 | 7.0 | 7.0 |
| SURFYNOL ™ 440 [g] | 0.7 | 0.7 | 0.7 | 0.7 | 0.7 | 0.7 |
| X-50-860A [g] | 0.1 | 0.1 | 0.1 | 0.1 | 0.1 | 0.1 |
| Isopropanol [g] | 10 | 10 | 10 | 10 | 10 | 10 |
| PIG01 (30%) [g] | — | 3.7 | — | — | — | — |
| PIG02 (30%) [g] | — | — | 4.0 | — | — | — |
| PIG03 (30%) [g] | — | — | — | 2.0 | — | — |
| PIG04 (30%) [g] | — | — | — | — | 4.0 | — |
| PIG05 (30%) [g] | — | — | — | — | — | 3.0 |
| Total [g]: | 96.4 | 100.1 | 100.1 | 100.1 | 100.1 | 100.1 |
| wt % water in aq. medium | 70.2 | 71.2 | 71.1 | 71.3 | 71.1 | 71.2 |
| Viscosity [mPa.s] | 200 | 745 | 470 | 215 | 320 | 615 |

The flexographic inks of INVENTION EXAMPLE 1 was non-pigmented and those of INVENTION EXAMPLES 2 to 6 were pigmented. The flexographic ink of INVENTION EXAMPLE 2 was coloured violet, that of INVENTION EXAMPLE 3 was coloured yellow, those of INVENTION EXAMPLES 4 and 6 were coloured cyan, and that of INVENTION EXAMPLE was coloured red.

The viscosity of the flexographic inks was determined at 25° C. according to DIN 53211 using a DIN 4 cup by stirring the flexographic ink until a constant emptying time is measured. Standard conversion tables are used to convert the emptying times into dynamic viscosities (cSt) and a density of 1 is assumed in converting the dynamic viscosities values into mPa.s.

Flexographic Printing

The flexographic inks of INVENTION EXAMPLES 1 to 6 were printed using a RK Esiproof handtester from RK Print Coat Instruments Ltd, UK provided with a 140 cells/inch chrome-plated anilox drum.

The compositions of the printed layers as solids after drying are given in Table 4, together with the surface resistance of the layers and their optical densities as determined using a MacBeth™ RD918 SB with the colour filters given with the optical density values in Table 4.

TABLE 4

| | Invention Example nr | | | | | |
|---|---|---|---|---|---|---|
| | 1 | 2 | 3 | 4 | 5 | 6 |
| wt % PEDOT/PSS | 37.4 | 28.7 | 28.1 | 32.1 | 28.1 | 29.9 |
| wt % binder | 40.5 | 31.0 | 30.4 | 34.7 | 30.4 | 32.5 |
| wt % pigment | — | 23.3 | 24.9 | 14.2 | 24.9 | 19.9 |
| wt % SURFYNOL ™ 440 | 19.4 | 14.9 | 14.5 | 16.6 | 14.5 | 15.5 |
| wt % X-50-860A | 2.7 | 2.1 | 2.1 | 2.4 | 2.1 | 2.2 |
| Surface resistance [kΩ/square] | 10.5 | 8.2 | 10 | 6.7 | 6.6 | 6.1 |

TABLE 4-continued

| | Invention Example nr | | | | | |
|---|---|---|---|---|---|---|
| | 1 | 2 | 3 | 4 | 5 | 6 |
| OD [Macbeth™ RD918SB] | — | 0.65 [$D_{green}$] | 0.72 [$D_{blue}$] | 0.52 [$D_{red}$] | 0.62 [$D_{green}$] | 0.67 [$D_{red}$] |

The surface resistance of the non-pigmented print produced with the flexographic ink of INVENTION EXAMPLE 1 was 10,500 Ω/square. Coloured prints with optical densities between 0.52 and 0.72 were obtained with the flexographic inks of INVENTION EXAMPLES 2 to 6 with surface resistances between 6100 and 8200 Ω/square. The prints exhibited excellent adhesion to the substrate, excellent solvent resistance and excellent water resistance.

INVENTION EXAMPLE 7

The non-pigmented flexographic ink of INVENTION EXAMPLE 7 was prepared by adding with mixing the ingredients in the quantities given in Table 5 to 450 g of a 3% by weight dispersion of PEDOT/PSS in water after mixing with the deionized water.

TABLE 5

| | | |
|---|---|---|
| 3 wt % aqueous PEDOT/PSS dispersion [g] | 450 | 13.5 (solids) |
| DW [g] | 172.5 | — |
| LATEX21 [g] | 37.5 | 15.0 (solids) |
| LATEX22 [g] | 14 | 4.2 (solids) |
| PD [g] | 25 | — |
| DEG-MME [g] | 45 | — |
| DEG [g] | 70 | — |
| SYNPERONIC™ 13/6.55 (100%) [g] | 10 | 10 (solids) |

TABLE 5-continued

| | | |
|---|---|---|
| X-50-860A [g] | 1.0 | 1.0 (solids) |
| isopropanol [g] | 200 | — |
| Total [g]: | 1025 | 43.7 (solids) |
| wt % water in aqueous medium | | 60.1 |
| Viscosity [mPa·s] | | 750 |

The viscosity of the flexographic inks was determined at 25° C. according to DIN 53211 using a DIN 4 cup by stirring the flexographic ink until a constant emptying time is measured. Standard conversion tables are used to convert the emptying times into dynamic viscosities (cSt) and a density of 1 is assumed in converting the dynamic viscosities values into mPa.s.

Flexographic Printing

The flexographic inks of INVENTION EXAMPLE 7 was printed on different supports using a RK Esiproof handtester from RK Print Coat Instruments Ltd, UK provided with a 140 cells/inch chrome-lated anilox drum. The compositions of the printed layers as solids after drying are given in Table 6, together with the surface resistance of the layers and their optical densities in reflection as determined using a MacBeth™ RD918 SB densitometer with a visible filter or in transmission as determined using a MacBeth™ TR904 densitometer with an ortho filter.

The flexographic ink of INVENTION EXAMPLE 7 exhibited excellent or very good wetting behaviour on all eight substrates investigated, six non-porous (substrates 1 to 6) and two porous (substrates 7 and 8). The surface resistances observed varied strongly with support, markedly higher surface resistances being observed with substrates 3 and 5: cellulose triacetate film and TRANSPAREX™ film.

TABLE 6

| | Invention Example nr 7 | | | | | | | |
|---|---|---|---|---|---|---|---|---|
| substrate nr | 1 | 2 | 3 | 4 | 5 | 6 | 7 | 8 |
| wt % PEDOT/PSS | | | | 30.9 | | | | |
| wt % binder | | | | 43.9 | | | | |
| wt % pigment | | | | — | | | | |
| wt % SYNPERONIC™ 13/6.55 | | | | 22.9 | | | | |
| wt % X-50-860A | | | | 2.3 | | | | |
| Surface resistance [kΩ/square] | 6.5 | 12.8 | 150 | 9.7 | 160 | 5.9 | 5.4 | 1.2 |
| wetting behaviour | excellent | very good | excellent | excellent | very good | excellent | very good | excellent |
| adhesion | excellent | excellent | excellent | excellent | excellent | excellent | excellent | excellent |
| overprintability | excellent | excellent | — | — | — | — | — | — |
| OD [MacBeth™ TD904] | <0.01 | — | <0.01 | <0.01 | <0.01 | <0.01 | — | — |
| OD [MacBeth™ RD918SB] | — | 0.07 | — | — | — | — | 0.18 | 0.09 |

Upon coating substrate 2 twice with intermediate drying the surface resistance decreased from 12,800 to just below 5,000 Ω/square.

INVENTION EXAMPLES 8 to 19

The non-pigmented flexographic ink of INVENTION EXAMPLES 8 to 19 were prepared by adding with mixing the ingredients in the quantities given in Table 7 to 45 g of a 3% by weight dispersion of PEDOT/PSS in water after mixing with the deionized water.

The viscosity of the flexographic inks was determined at 25° C. according to DIN 53211 using a DIN 4 cup by stirring the flexographic ink until a constant emptying time is measured. Standard conversion tables were used to convert the emptying times into dynamic viscosities (cSt) and a density of 1 was assumed in converting the dynamic viscosities values into mpa.s.

TABLE 7

|  | Invention Example nr | | | | | |
| --- | --- | --- | --- | --- | --- | --- |
|  | 8 | 9 | 10 | 11 | 12 | 13 |
| 3% aq. PEDOT/PSS disp. [g] | 45 | 45 | 45 | 45 | 45 | 45 |
| DW [g] | 24.2 | 11.7 | 24.2 | 11.7 | 24.2 | 11.7 |
| LATEX14 [g] | 1.8 | 1.8 | 1.8 | 1.8 | 1.8 | 1.8 |
| LATEX22 [g] | 1.4 | 1.4 | 1.4 | 1.4 | 1.4 | 1.4 |
| PD [g] | 2.5 | 2.5 | 2.5 | 2.5 | 2.5 | 2.5 |
| DEG-MME [g] | 4.5 | 4.5 | 4.5 | 4.5 | 4.5 | 4.5 |
| DEG [g] | 7.0 | 7.0 | 7.0 | 7.0 | 7.0 | 7.0 |
| ZONYL ™ FSO100 [g] | 1.05 | 1.05 | 1.05 | 1.05 | 1.05 | 1.05 |
| X50-860A [g] | 0.1 | 0.1 | 0.1 | 0.1 | 0.1 | 0.1 |
| isopropanol [g] | 12.5 | 25 | — | — | — | — |
| n-propanol [g] | — | — | 12.5 | 25 | — | — |
| isobutanol [g] | — | — | — | — | 12.5 | 25 |
|  | 100.05 | 100.05 | 100.05 | 100.05 | 100.05 | 100.05 |
| wt % water in aqueous medium | 68.4 | 53.5 | 68.4 | 53.5 | 68.4 | 53.5 |
| viscosity [mPa.s] | 230 | 700 | 300 | 600 | 230 | 125 |
|  | Invention Example nr | | | | | |
|  | 14 | 15 | 16 | 17 | 18 | 19 |
| 3% aq. PEDOT/PSS disp. [g] | 45 | 45 | 45 | 45 | 45 | 45 |
| DW [g] | 24.2 | 11.7 | 24.2 | 11.7 | 11.5 | 11.4 |
| LATEX14 [g] | 1.8 | 1.8 | 1.8 | 1.8 | 1.8 | 1.8 |
| LATEX22 [g] | 1.4 | 1.4 | 1.4 | 1.4 | 1.4 | 1.4 |
| PD [g] | 2.5 | 2.5 | 2.5 | 2.5 | 2.5 | 2.5 |
| DEG-MME [g] | 4.5 | 4.5 | 4.5 | 4.5 | 4.5 | 4.5 |
| DEG [g] | 7.0 | 7.0 | 7.0 | 7.0 | 7.0 | 7.0 |
| ZONYL ™ FSO100 [g] | 1.05 | 1.05 | 1.05 | 1.05 | 1.05 | 1.05 |
| ascorbic acid [g] | — | — | — | — | 0.15 | 0.3 |
| X50-860A [g] | 0.1 | 0.1 | 0.1 | 0.1 | 0.1 | 0.1 |
| isopropanol [g] | — | — | — | — | 25 | 25 |
| ethanol [g] | 12.5 | 25 | — | — | — | — |
| methanol [g] | — | — | 12.5 | 25 | — | — |
|  | 100.05 | 100.05 | 100.05 | 100.05 | 100 | 100.05 |
| wt % water in aqueous medium | 68.4 | 53.5 | 68.4 | 53.5 | 53.3 | 53.2 |
| viscosity [mPa.s] | 210 | 600 | 175 | 325 | 325 | 325 |

Flexographic Printing

The flexographic inks of INVENTION EXAMPLES 8 to 19 were printed on substrate 2 using a RK Esiproof handtester from RK Print Coat Instruments Ltd, UK provided with a 140 cells/inch chrome-plated anilox drum.

The compositions of the printed layers as solids after drying are given in Table 8, together with the surface resistance of the layers and their optical densities as determined using a MacBeth™ RD918 SB with a visible filter. Table 8 also includes the surface resistances of several of the prints after 1, 2 and 7 days exposure to daylight.

TABLE 8

| | Invention Example nr | | | | | | | | | | | |
|---|---|---|---|---|---|---|---|---|---|---|---|---|
| | 8 | 9 | 10 | 11 | 12 | 13 | 14 | 15 | 16 | 17 | 18 | 19 |
| wt % PEDOT/PSS in layer | 34.1 | 34.1 | 34.1 | 34.1 | 34.1 | 34.1 | 34.1 | 34.1 | 34.1 | 34.1 | 32.8 | 31.7 |
| wt % binder | 36.9 | 36.9 | 36.9 | 36.9 | 36.9 | 36.9 | 36.9 | 36.9 | 36.9 | 36.9 | 35.6 | 34.4 |
| wt % pigment | — | — | — | — | — | — | — | — | — | — | — | — |
| wt % ZONYL ™ FSO100 | 26.5 | 26.5 | 26.5 | 26.5 | 26.5 | 26.5 | 26.5 | 26.5 | 26.5 | 26.5 | 25.5 | 24.6 |
| wt % X-50-860A | 2.5 | 2.5 | 2.5 | 2.5 | 2.5 | 2.5 | 2.5 | 2.5 | 2.5 | 2.5 | 2.4 | 2.3 |
| wt % ascorbic acid | — | — | — | — | — | — | — | — | — | — | 3.7 | 7.0 |
| Initial surface resistance [kΩ/square] | 9.0 | 3.2 | — | — | — | — | — | — | — | — | 4.2 | 3.8 |
| Surface resistance after 1d daylight [kΩ/square] | 20.0 | 5.7 | — | — | — | — | — | — | — | — | 6.0 | 5.6 |
| Surface resistance after 2d daylight [kΩ/square] | 25.0 | 6.8 | — | — | — | — | — | — | — | — | 6.5 | 5.9 |
| Surface resistance after 7d daylight [kΩ/square] | 65.0 | 11.0 | — | — | — | — | — | — | — | — | 8.5 | 6.5 |
| R(after 7d daylight)/R(initial) | 7.22 | 3.44 | — | — | — | — | — | — | — | — | 2.02 | 1.71 |

Comparison of the R(after 7d daylight)/R(initial) value for prints produced with the flexographic inks of INVENTION EXAMPLES 8 and 9 show that higher dilution with isopropanol improved the stability of the prints to daylight exposure: 3.44 compared with 7.22. Comparison of the R(after 7d daylight)/R(initial) value for prints produced with the flexographic inks of INVENTION EXAMPLES 9, 18 and 19, shows that a further improvement in stability to daylight exposure could be obtained by incorporating ascorbic acid: 2.02 and 1.71 for prints containing 3.7 and 7.0% by weight ascorbic acid respectively compared with 3.44 for prints without ascorbic acid.

the quantities given in Table 9 to 45 g of a 3% by weight dispersion of PEDOT/PSS in water after mixing with the deionized water.

The viscosity of the flexographic inks was determined at 25° C. according to DIN 53211 using a DIN 4 cup by stirring the flexographic ink until a constant emptying time is measured. Standard conversion tables were used to convert the emptying times into dynamic viscosities (cSt) and a density of 1 was assumed in converting the dynamic viscosities values into mPa.s.

TABLE 9

| | Invention Example nr | | | | | | | | | | | |
|---|---|---|---|---|---|---|---|---|---|---|---|---|
| | 20 | 21 | 22 | 23 | 24 | 25 | 26 | 27 | 28 | 29 | 30 | 31 |
| 3wt % aq. PEDOT/PSS disp. [g] | 45 | 45 | 45 | 45 | 45 | 45 | 45 | 45 | 45 | 45 | 45 | 45 |
| DW [g] | 18.3 | 17.3 | 16.3 | 10.3 | 16.3 | 10.3 | 17.5 | 15.3 | 15.1 | 5.5 | 17.3 | 14.3 |
| LATEX21 [g] | 3.75 | 3.75 | 3.75 | 3.75 | 3.75 | 3.75 | 3.75 | 3.75 | 3.75 | 3.75 | 3.75 | 3.75 |
| LATEX22 [g] | 1.4 | 1.4 | 1.4 | 1.4 | 1.4 | 1.4 | 1.4 | 1.4 | 1.4 | 1.4 | 1.4 | 1.4 |
| PD [g] | 2.5 | 2.5 | 2.5 | 2.5 | 2.5 | 2.5 | 2.5 | 2.5 | 2.5 | 2.5 | 2.5 | 2.5 |
| DEG-MME [g] | 4.5 | 4.5 | 4.5 | 4.5 | 4.5 | 4.5 | 4.5 | 4.5 | 4.5 | 4.5 | 4.5 | 4.5 |
| DEG [g] | 7.0 | 7.0 | 7.0 | 7.0 | 7.0 | 7.0 | 7.0 | 7.0 | 7.0 | 7.0 | 7.0 | 7.0 |
| NON03 [g] | 0.4 | 1.6 | — | — | — | — | — | — | — | — | — | — |
| AMP01 [g] | — | — | 2.0 | 8.0 | — | — | — | — | — | — | — | — |
| N0N04 (20%) [g] | — | — | — | — | 2.0 | 8.0 | — | — | — | — | — | — |
| NON05 (50%) [g] | — | — | — | — | — | — | 0.8 | 3.2 | — | — | — | — |
| AN01 (12.5%) [g] | — | — | — | — | — | — | — | — | 3.2 | 12.8 | — | — |
| AN02 [g] | — | — | — | — | — | — | — | — | — | — | 1.0 | 4.0 |
| X-50-860A [g] | 0.1 | 0.1 | 0.1 | 0.1 | 0.1 | 0.1 | 0.1 | 0.1 | 0.1 | 0.1 | 0.1 | 0.1 |
| Isopropanol [g] | 20 | 20 | 20 | 20 | 20 | 20 | 20 | 20 | 20 | 20 | 20 | 20 |
| Total [g]: | 102.95 | 103.15 | 102.55 | 102.55 | 102.55 | 102.55 | 102.55 | 102.75 | 102.55 | 102.55 | 102.55 | 102.55 |
| wt % water in aq. medium | 65.7 | 65.4 | 65.0 | 62.7 | 65.6 | 65.2 | 65.6 | 65.2 | 65.6 | 65.2 | 65.6 | 65.0 |
| Viscosity [mPa.s] | 300 | 375 | 225 | <60 | 450 | 700 | 300 | 350 | 350 | 450 | 375 | 300 |

INVENTION EXAMPLES 20 to 31

The flexographic inks of INVENTION EXAMPLES 20 to 31 were prepared by adding with mixing the ingredients in The flexographic inks of INVENTION EXAMPLES 20 to 31 all exhibited excellent wetting behaviour on porous and non-porous substrates.

INVENTION EXAMPLES 32 to 43

The flexographic inks of INVENTION EXAMPLES 32 to 43 were prepared by adding with mixing the ingredients in the quantities given in Table 10 to 45 g of a 3% by weight dispersion of PEDOT/PSS in water after mixing with the deionized water.

The viscosity of the flexographic inks was determined at 25° C. according to DIN 53211 using a DIN 4 cup by stirring the flexographic ink until a constant emptying time is measured. Standard conversion tables are used to convert the emptying times into dynamic viscosities (cSt) and a density of 1 is assumed in converting the dynamic viscosities values into mPa.s.

TABLE 10

| | Invention Example nr | | | | | | | | | | | |
|---|---|---|---|---|---|---|---|---|---|---|---|---|
| | 32 | 33 | 34 | 35 | 36 | 37 | 38 | 39 | 40 | 41 | 42 | 43 |
| 3 wt % aq. PEDOT/PSS disp. [g] | 45 | 45 | 45 | 45 | 45 | 45 | 45 | 45 | 45 | 45 | 45 | 45 |
| DW [g] | 12.0 | — | 15.1 | 12.4 | 15.6 | 14.4 | 15.6 | 14.4 | 12.0 | — | 12.0 | — |
| LATEX21 [g] | 3.75 | 3.75 | 3.75 | 3.75 | 3.75 | 3.75 | 3.75 | 3.75 | 3.75 | 3.75 | 3.75 | 3.75 |
| LATEX22 [g] | 1.4 | 1.4 | 1.4 | 1.4 | 1.4 | 1.4 | 1.4 | 1.4 | 1.4 | 1.4 | 1.4 | 1.4 |
| PD [g] | 2.5 | 2.5 | 2.5 | 2.5 | 2.5 | 2.5 | 2.5 | 2.5 | 2.5 | 2.5 | 2.5 | 2.5 |
| DEG-MME [g] | 4.5 | 4.5 | 4.5 | 4.5 | 4.5 | 4.5 | 4.5 | 4.5 | 4.5 | 4.5 | 4.5 | 4.5 |
| DEG [g] | 7.0 | 7.0 | 7.0 | 7.0 | 7.0 | 7.0 | 7.0 | 7.0 | 7.0 | 7.0 | 7.0 | 7.0 |
| AN03 [g] | 4.0 | 16.0 | — | — | — | — | — | — | — | — | — | — |
| AN04 [g] | — | — | 0.89 | 3.56 | — | — | — | — | — | — | — | — |
| N0N02 [g] | — | — | — | — | 0.4 | 1.6 | — | — | — | — | — | — |
| NON06 [g] | — | — | — | — | — | — | 0.4 | 1.6 | — | — | — | — |
| AN05 (5%) [g] | — | — | — | — | — | — | — | — | 4.0 | 16.0 | — | — |
| AN06 (1.44%) [g] | — | — | — | — | — | — | — | — | — | — | 4.0 | 16.0 |
| X-50-860A [g] | 0.1 | 0.1 | 0.1 | 0.1 | 0.1 | 0.1 | 0.1 | 0.1 | 0.1 | 0.1 | 0.1 | 0.1 |
| Isopropanol [g] | 20 | 20 | 20 | 20 | 20 | 20 | 20 | 20 | 20 | 20 | 20 | 20 |
| Total [g]: | 100.25 | 100.25 | 100.24 | 100.21 | 100.25 | 100.25 | 100.25 | 100.25 | 100.25 | 100.25 | 100.25 | 100.25 |
| wt % water in aq. medium | 64.9 | 64.9 | 64.8 | 64.3 | 64.8 | 64.3 | 64.8 | 64.3 | 64.8 | 64.6 | 64.9 | 64.8 |
| Viscosity [mPa.s] | >1250 | 800 | 400 | 250 | 350 | 500 | 500 | 500 | 600 | 500 | 450 | 500 |

The flexographic inks of INVENTION EXAMPLES 32 to 43 all exhibited excellent wetting behaviour on both porous and non-porous substrates.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. A flexographic ink containing a polymer or copolymer of a 3,4-dialkoxythiophene in which the two alkoxy groups may be the same or different or together represent an optionally substituted oxy-alkylene-oxy bridge, a polyanion and a latex binder in an organic solvent or aqueous medium, wherein said polymer or copolymer of a 3,4-dialkoxythiophene is present in a concentration of at least 0.1% by weight in said flexographic ink and that said flexographic ink is capable of producing a colorimetrically additive transparent print, wherein said flexographic ink is exclusive of a dye and said flexographic ink contains a pigment and a non-Newtonian binder.

2. The flexographic ink according to claim 1, wherein said polymer or copolymer of a 3,4-dialkoxythiophene is present in a concentration of at least 0.2% by weight in said ink.

3. The flexographic ink according to claim 1, wherein said flexographic ink further contains a water-miscible organic solvent which is selected from the group consisting of aliphatic alcohols, ketones, arenes, esters, glycol ethers, cyclic ethers and their mixtures.

4. The flexographic ink according to claim 1, wherein said flexographic ink further contains a di- or polyhydroxy- and/or carboxy groups or amide or lactam group containing organic compound.

5. The flexographic ink according to claim 4, said di- or polyhydroxy- and/or carboxy groups or amide or lactam group containing organic compound is selected from the group consisting of 1,2-propandiol, propylene glycol, diethylene glycol, N-methyl pyrrolidinone and di(ethylene glycol)ethyl ether acetate.

6. The flexographic ink according to claim 1, wherein said flexographic ink further contains an aprotic compound with a dielectric constant $\geq 15$.

7. The flexographic ink according to claim 1, wherein said polymer or copolymer of a (3,4-dialkoxythiophene) is selected from the group consisting of: poly(3,4-methylenedioxy-thiophene), poly(3,4-methylenedioxythiophene) derivatives, poly(3,4-ethylenedioxythiophene), poly(3,4-ethylenedioxythiophene) derivatives, poly[3,4-(propylene-dioxy)thiophene], poly[3,4-(propylenedioxy)thiophene] derivatives, poly(3,4-butylenedioxythiophene), poly(3,4-butylenedioxythiophene) derivatives and copolymers thereof.

8. The flexographic ink according to claim 1, wherein said polyanion is poly(styrenesulfonate).

9. The flexographic ink according to claim 1, wherein said flexographic ink has a viscosity at 25° C. after stirring to constant viscosity of at least 130 mPas as measured according to DIN 53211.

10. The flexographic ink according to claim 1, wherein said flexographic ink has a pH between 1.5 and 5.5.

11. A method for preparing a non-dye containing flexographic ink, containing a polymer or copolymer of a 3,4-dialkoxythiophene in which the two alkoxy groups may be the same or different or together represent an optionally substituted oxy-alkylene-oxy bridge, a polyanion and a latex binder in an organic solvent or aqueous medium, wherein said polymer or copolymer of a 3,4-dialkoxythiophene is present in a concentration of at least 0.1% by weight in said flexographic ink and said flexographic ink is capable of producing a colorimetrically additive transparent print, comprising the steps of: i) concentrating an aqueous dispersion of said polymer or copolymer of (3,4-dialkoxythiophene) and said polyanion by evaporation of water after addition of at least one organic solvent or evaporation of water by freeze drying; and ii) adding said latex binder.

12. The method according to claim 11, wherein in the evaporation of water after addition of at least one organic solvent said evaporation of water is continued until the content of water therein is reduced by at least 65% by weight.

13. The method according to claim 11, wherein in the evaporation of water after addition of at least one organic solvent said evaporation of water is continued until the content of water therein is reduced by at least 80% by weight.

14. The method according to claim 11, wherein the concentration of the aqueous polymer or copolymer of (3,4-dialkoxythiophene) and the polyanion by the evaporation of water by freeze drying yields a dry product or a paste that is redispersible or soluble.

15. The method of claim 11, wherein the latex binder is a non-Newtonian binder.

16. A flexographic printing process comprising the steps of: providing a non-dye containing flexographic ink, containing a polymer or copolymer of a 3,4-dialkoxythiophene in which the two alkoxy groups may be the same or different or together represent an optionally substituted oxy-alkylene-oxy bridge, a polyanion and a latex binder in an organic solvent or aqueous medium, wherein said polymer or copolymer of a 3,4-dialkoxythiophene is present in a concentration of at least 0.1% by weight in said flexographic ink and said flexographic ink is capable of producing a colorimetrically additive transparent print, printing said printing ink on an optionally subbed substrate thereby producing a colorimetrically additive transparent print.

17. The flexographic printing process according to claim 16, wherein said support is a flexible substrate.

18. The flexographic printing process according to claim 16, wherein said substrate is paper, polymer film, glass or ceramic.

19. A flexographic ink containing a polymer or copolymer of a 3,4-dialkoxythiophene in which the two alkoxy groups may be the same or different or together represent an optionally substituted oxy-alkylene-oxy bridge, a polyanion and a latex binder in an organic solvent or aqueous medium, wherein said polymer or copolymer of a 3,4-dialkoxythiophene is present in a concentration of at least 0.1% by weight in said ink and that said ink is capable of producing a colorimetrically additive transparent print, wherein said flexographic ink is exclusive of a dye and said flexographic ink contains a pigment.

20. Flexographic ink according to claim 19, wherein said polymer or copolymer of a 3,4-dialkoxythiophene is present in a concentration of at least 0.2% by weight in said ink.

21. Flexographic ink according to claim 19, wherein said flexographic ink further contains a water-miscible organic solvent which is selected from the group consisting of aliphatic alcohols, ketones, arenas, esters, glycol ethers, cyclic ethers and their mixtures.

22. Flexographic ink according to claim 19, wherein said flexographic ink further contains a di- or polyhydroxy- and/or carboxy groups or amide or lactam group containing organic compound.

23. Flexographic ink according to claim 19, wherein said di- or polyhydroxy- and/or carboxy groups or amide or lactam group containing organic compound is selected from the group consisting of 1,2-propandiol, propylene glycol, diethylene glycol, N-methyl pyrrolidinone and di(ethylene glycol)ethyl ether acetate.

24. Flexographic ink according to claim 19, wherein said flexographic ink further contains an aprotic compound with a dielectric constant $\geq 15$.

25. Flexographic ink according to claim 19, wherein said polymer or copolymer of a (3,4-dialkoxythiophene) is selected from the group consisting of: poly(3,4-methylenedioxy-thiophene), poly(3,4-methylenedioxythiophene) derivatives, poly(3,4-ethylenedioxythiophene), poly(3,4-ethylenedioxythiophene) derivatives, poly[3,4-(propylene-dioxy)thiophene], poly[3,4-(propylenedixoy)thiophene] derivatives, poly(3,4-butylenedioxythiophene), poly(3,4-butylenedioxythiophene) derivatives and copolymers therewith.

26. Flexographic ink according to claim 19, wherein said polyanion is poly(styrenesulfonate).

27. Flexographic ink according to claim 19, wherein said ink has a viscosity at 25° C. after stirring to constant viscosity of at least 130 mPa.s as measured DIN 53211.

28. Flexographic ink according to claim 19, wherein said flexographic ink has a pH between 1.5 and 5.5.

* * * * *